(12) United States Patent
Nayfeh et al.

(10) Patent No.: US 6,585,947 B1
(45) Date of Patent: Jul. 1, 2003

(54) METHOD FOR PRODUCING SILICON NANOPARTICLES

(75) Inventors: Munir H. Nayfeh, Urbana, IL (US); Joel Therrien, Urbana, IL (US); Zain H. Yamani, Kfupm (SA)

(73) Assignee: The Board of Trustees of the University of Illinois, Urbana, IL (US)

(*) Notice: Subject to any disclaimer, the term of this patent is extended or adjusted under 35 U.S.C. 154(b) by 0 days.

(21) Appl. No.: 09/426,389

(22) Filed: Oct. 22, 1999

(51) Int. Cl.$^7$ .............................. C01B 33/02; C25F 3/12
(52) U.S. Cl. ....................... 423/348; 205/656; 205/674; 205/686
(58) Field of Search .................... 423/348; 205/656, 205/674, 686

(56) References Cited

U.S. PATENT DOCUMENTS

| | | | |
|---|---|---|---|
| 4,931,692 A | 6/1990 | Takagi et al. | 313/503 |
| 5,308,804 A | 5/1994 | Lee | 501/17 |
| 5,527,386 A | 6/1996 | Statz | 106/481 |
| 5,561,679 A | 10/1996 | Mannik et al. | 372/43 |
| 5,690,807 A | * 11/1997 | Clark, Jr. et al. | 205/655 |
| 5,695,617 A | 12/1997 | Graiver et al. | 204/157.41 |
| 5,714,766 A | 2/1998 | Chen et al. | 257/17 |
| 5,747,180 A | 5/1998 | Miller et al. | 428/601 |
| 5,770,022 A | 6/1998 | Chang et al. | 204/164 |
| 5,891,548 A | 4/1999 | Graiver et al. | 428/98 |
| 5,932,889 A | 8/1999 | Matsumura et al. | 257/14 |
| 5,942,748 A | 8/1999 | Russell et al. | 250/214.1 |
| 6,060,743 A | 5/2000 | Sugiyama et al. | 257/321 |

OTHER PUBLICATIONS

Sandip Tiwari, Farhan Rana. Hussein Hanafi, Allan Hartstein, Emmanuel F. Crabbe, and Kevin Chan, "A silicon nanocrystals based memory", Appl. Phys. Lett. 68 (10), Mar. 4, 1996, pp. 1377–1379.

G.M. Credo, M.D. Mason, and S.K. Buratto, "External quantum efficiency of single porous silicon nanoparticles", Applied Physics Letters, vol. 4. No. 14, Apr. 5, 1999, pp. 1978–1980.

J. Earland, P. Yu, S.I. Bozhevolnyi. J.M. Hvam, N.N. Ledentsov, "Second harmonic spectroscopy of semiconductor nanostructures", Quantum Electronics and Laser Science Conference Technical Digest, May 1999, pp. 233–234.

Xinwei Zhao. OlafSchoenfeld. Jun–ichi Kusano, Yoshinobu Aoyagi and Takuo Sugano, "Observation of Direct Transition in Silicon Nanocrystallites". Jpn. J. Appl. Phys., vol. 33, Jul. 1, 1994, Pt. 2, No. 7A, pp. L899–L901.

D.J. DiMaria, J.R. Kirtley, E.J. Pakulis, D.W. Dong, T.S. Kuan, F.L. Pesavento, T.N. Theis, and J.A. Cutro, S.D. Brorson, "Electroluminescence studies in silicon dioxide films containing tiny silicon islands", J. Appl. Phys., 56 (2), 15 Jul. 6, 1984, pp. 401–416.

S. Juen, K. Überbacher, J. Baldauf, K.F. Lamprecht, R. Tessadri, R. Lackner, R.A. Höpfel, "Technology and Photoluminescence of GaAs Micro– and Nanocrystallites", Superlattices and Microstructures, vol. 11 No. 2, 1992, pp. 181–184.

(List continued on next page.)

Primary Examiner—Stanley S. Silverman
Assistant Examiner—Maribel Medina
(74) Attorney, Agent, or Firm—Greer, Burns & Crain, Ltd.

(57) ABSTRACT

A method for producing the silicon nanoparticle of the invention is a gradual advancing electrochemical etch of bulk silicon. Separation of nanoparticles from the surface of the silicon may also be conducted. Once separated, various methods may be employed to form nanoparticles into colloids, crystals, films and other desirable forms. The particles may also be coated or doped.

18 Claims, 32 Drawing Sheets

(9 of 32 Drawing Sheet(s) Filed in Color)

OTHER PUBLICATIONS

K.A. Littau, P.J. Szajowski. A.J. Muller, A.R. Kortan, and L.E. Brus, "A Luminescent Silicon Nanocrystal Colloid via a High–Temperature Aerosol Reaction", The Journal of Physical Chemistry, vol. 97, No. 6, 1993, pp. 1224–1230.

Anton Fojtik, Arnim Henglein. "Luminescent colloidal silicon particles", Chemical Physics Letters 221, Apr. 29, 1994, pp. 363–367.

L.A. Chiu, A.A. Seraphin, and K.D. Kolenbrander, "Gas Phase Synthesis and Processing of Silicon Nanocrystallites: Characterization by Photoluminescence Emission Spectroscopy", Journal of Electronic Materials, vol. 23, No. 3, 1994.

Xinwei Zhao. OlafSchoenfeld. Jun–ichi Kusano, Yoshinobu Aoyagi and Takuo Sugano, "Observation of Direct Transition in Silicon Nanocrystallites". Jpn. J. Appl. Phys., vol. 33, Jul. 1, 1994, Pt. 2, No. 7A, pp. L899–L901.

E. Werwa, A.A. Seraphin and K.D. Kolenbrander, Excitation Intensity and Temperature Dependent Photoluminescence Behavior of Silicon Nanoparticles, Material Research Society Symposium Proceedings, vol. 452 pp. 129–134, 1997.

R.W. Collins, P.M. Fauchet, I. Shimizu, J.C. Vial, T. Shimada and A.P. Alivisatos, Luminescence Properties of Silicon Nanocrystals, Advances in Microcrystalline and Nanocrystaline Semiconductor Symposium, Bosyton, MA, ;USA, Dec. 2–6, 1996 (abstract).

Shoutain Li, Stuard J. Silvers and M. Samy El–Shall, Luminescence Properties of Silicon Nanocrystals, Material Researchy Society Symposium Proceedings, vol. 452, pp. 141–146, 1997.

Kouichi Murakami and Tetsuya Makimura, Silicon nanoparticles with visible light emission –Laser ablation–, Oyo Buturi, vol. 67, No. 7, pp. 817–821, Jul. 1998 (with verified translation).

U.S. patent application Nayfeh et al., Ser. No. 09/781,147, entitled Silicon Nanoparticle Electronic Switches, filed on Feb. 8, 2001.

U.S. patent application Nayfeh et al., Ser. No. 09/572,121 entitled Silicon Nanoparticle Microcrystal Nonlinear Optical Devices, filed on May 17, 2000.

U.S. patent application Nayfeh et al., Ser. No. 09/496,506 entitled Silicon Nanoparticle Field Effect Transistor And Transistor Memory Device, filed on Feb. 2, 2000.

U.S. patent application Nayfeh et al., Ser. No. 09/426,204 entitled Silicon Nanoparticle Stimulated Emission Devices, filed on Oct. 25, 1999.

J.L. Heinrich, C.L. Curtis, G.M. Credo, K.L. Kavanagh, M.J. Sailor, "Luminescent Colloidal Silicon Suspensions from Porous Silicon", Science, vol. 255, Jan. 3, 1992, pp. 66–68.

S. T. Yau, D. Saltz, M. H. Nayfeh, "Laser–Assisted Deposition of Nanometer Structures Using Scanning Tunneling Microscopy", Appl. Phys. Lett., vol. 57, No. 27, Dec. 31, 1990, pp. 2913–2915.

S.T. Yau, X. Zheng, M.H. Nayfeh, "Nanolithography of Chemically Prepared Si With a Scanning Tunneling Microscopy", Appl. Phys. Lett., vol. 59, No. 19, Nov. 4, 1991, pp. 2457–2459.

M. Nayfeh, "Fabrication of Nanometer Scale Structures", SPIE Institutes, vol. IS 10, (1993), pp. 200–217.

D. Andsager, J. Hilliard, J.M. Hetrick, L.H. AbuHassan, M. Plisch, M.H. Nayfeh, "Quenching of Porous Silicon Photoluminescence by Deposition of Metal Adsorbates", J. Appl. Phys., vol. 74, No. 7, Oct. 1, 1993, pp. 4783–4785.

J. Hillard, D. Andsager, L. Abu Hassan, H.M. Nayfeh, M. H. Nayfeh, "Infrared Spectroscopy and Secondary Ion Mass Spectrometry of Luminescent, Nonluminescent and Metal Quenched Porous Silicon", J. Appl. Phys., vol. 76, No. 4, Aug. 15, 1994, pp. 2423–2428.

D. Andsager, J. Hilliard, M.H. Nayfeh, "Behavior of Porous Silicon Emission Spectra During Quenching by Immersion in Metal Ion Solutions", Appl. Phys. Lett., vol. 64, No. 9, Feb. 28, 1994, pp. 1141–1143.

D. Andsager, J.M. Hetrick, J. Hillard, M.H. Nayfeh, "Diffusion of Copper in Porous Silicon", J. of Appl. Phys., vol. 77, No. 9, May 1, 1995, pp. 1–4.

J.E. Hilliard, H.M. Nayfeh, M.H. Nayfeh, "Re–Establishment of Photoluminescence in Cu Quenched Porous Silicon by Acid Treatment", J. App. Phys., vol. 77, No. 8, Apr. 15, 1995, pp. 4130–4132.

N. Rigakis, J. Hillard, L. Abu Hassan, J. Hetrick, D. Andsager, M.H. Nayfeh, "Effect of Oxidation Treatments on Photoluminescence Excitation of Porous Silicon", J. App. Phys., vol. 81, No. 8, Jan. 1, 1997, pp. 440–444.

N. Rigagis, Z. Yamani, L. Abu Hassan , J. Hilliard, M.H. Nayfeh, "Time–Resolved Measurements of the Photoluminescence of Cu–Quenched Porous Silicon", Appl. Phys. Lett., vol. 69, 1996, pp. 2216–2218.

W.H. Thompson, Z. Yamani, L.H. Abu Hassan, J.E. Greene, M. Nayfeh, "Room Temperature Oxidation Enhancement of Porous Si(001) Using Ultraviolet–Ozone Exposure", J. Appl. Phys., vol. 80, No. 9, Nov. 1, 1996, pp. 5415–5421.

Z. Yamani, W.H. Thompson, L. Abu Hassan, M.H. Nayfeh, "Ideal Anodization of Silicon", Appl. Phys. Lett., vol. 70, No. 25, Jun. 23, 1997, pp. 3404–3406.

M.H. Nayfeh, N. Rigakis, Z. Yamani, "Photoexcitation of Si–Si Surface States in Nanocrystallites", Physical Review B, vol. 56, No. 4, Jul. 15, 1997, pp. 2079–2084.

Z. Yamani, S. Ashhab, A. Nayfeh, W.H. Thompson, M. Nayfeh, "Red to Green Rainbow Photoluminescence from Unoxidized Silicon Nanocrystallites", J. Appl. Phys., vol. 83, No. 7, Apr. 1, 1998, pp. 3929–3931.

Z. Yamani, N. Rigakis, M.H. Nayfeh, "Excitation of Size Selected Nanocrystallites in Porous Silicon", Appl. Phys. Lett., vol. 72, No. 20, May 18, 1998, pp. 2556–2558.

W.H. Thompson, Z. Yamani, L. Abu Hassan, O. Gurdal, M. Nayfeh, "The Effect of Ultrathin Oxides on Luminescent Silicon Nanocrystallites", Appl. Phys. Lett., vol. 73, No. 6, Aug. 10, 1998, pp. 841–843.

M.H. Nayfeh, N. Rigakis, Z. Yamani, "Photoexcitation of Si–Si Radiative Surface States in Nanocrystallites", Mater. Res. Soc. Proc., Boston, MA, 1997.

M.H. Nayfeh, Z. Yamani, O. Gurdal, A. Alaql, "Nanosructure of Porous Silicon using Transmission Microscopy", Mater. Res. Soc. Proc., Boston, MA, 1998.

Z. Yamani, A. Alaql, J. Therrien, O. Nayfeh, M. Nayfeh, "Revival of Interband Crystallite Reflectance from Nano–crystallites in Porous Silicon by Immersion Plating", Appl. Phys. Lett., vol. 74, No. 23, Jun. 7, 1999, pp. 3483–3485.

Z. Yamani, O. Gurdal, A. Alaql, M.H. Nayfeh, "Correlation of Diffuse Scattering with Nanocrystalline Size in Porous Silicon Using Transmission Microscopy", J. Appl. Phys., vol. 85, No. 12, Jun. 15, 1999, pp. 8050–8053.

L.T. Canham, "Silicon Quantum Wire Array Fabrication by Electrochemical and Chemical Dissolution of Wafers", Appl. Phys. Lett., vol. 57, No. 10, Sep. 3, 1990, pp. 1046–1048.

A.G. Cullis, L.T. Canham, P.D.J. Calcott, "The Structural and Luminescence Properties of Porous Silicon", *J. Appl. Phys.*, vol. 82, No. 3, Aug. 1, 1997, pp. 909–965.

J. Wang, H.B. Jiang, W.C. Wang, J.B. Zheng, F.L. Zhang, P.H. Hao, X.Y Hou, X. Wang, "Efficient Infrared–Up– 22, Conversion Luminescence in Porous Silicon: A Quantum–Confinement–Induced Effect", *Phys. Rev. Lett.*, vol. 69, No. Nov. 30, 1992, pp. 3252–3255.

J. Gole, D. Dixon, "Evidence for Oxide Formation from the Single and Multiphoton Excitation of a Porous Silicon Surface or Silicon 'Nanoparticles'", *J. Appl. Phys.*, vol. 83, No1. 11, Jun. 1, 1998, pp. 5985–5991.

F. Koch, "Models and Mechanisms for the Luminescence of Porous Si", Mater. Res. Soc. Symp. Proc., pp. 319–329.

R.P. Chin, Y.R. Shen, V. Petrova–Koch, "Photoluminescence from Porous Silison by Infrared Multiphoton Excitation" *Science*, vol. 270, Nov. 3, 1995, pp. 776–778.

S.I. Raider, R. Flitsch, M.J. Palmer, "Oxide Growth on Etched Silison in Air at Room Temperature", *J. Electrochem. Soc.*, vol. 122, No. 3, Mar. 1975, pp. 413–418.

U. Neuwald, A. Feltz, U. Memmert, R.J. Behm, "Chemical Oxidation of Hydrogen Passivated Si(111) Surfaces in $H_2O_2$", *J. Appl. Phys.*, vol. 78, No. 6, Sep. 15, 1995, pp. 4131–4136.

A. Pasquarello, M.S. Hybertsen, R. Car, "Si 2p Core–Level Shifts at the Si(001)–$SiO_2$ Interface: A First–Principles Study", *Phys. Rev. Lett.*, vol. 74, No. 6, Feb. 6, 1995, pp. 1024–1027.

M.H. Nayfeh, N. Rigakis, Z. Yamani, "Photoexcitation of Si–Si Radiative Surface States in Nanocrystallites", Mat. Res. Soc. Symp. Proc., vol. 486, pp. 243–248.

Z. Yamani, A. Alaql, J. Therrien, O. Nayfeh, M. Nayfeh, "Revival of Interband Crystalline Reflectance from Nano–c-rystallites in Porous Silicon by Immersion Plating", *Appl. Phys. Lett.*, vol. 74, No. 23, Jun. 7, 1999, pp. 3483–3485.

E. Hanamura, "Very Large Optical Nonlinearity of Semiconductor Microcrystallites", *Physical Rev. B*, vol. 37, No. 3, Jan. 15, 1988, pp. 1273–1279.

G. Allan, C. Delerue, M. Lannoo, "Nature of Luminescent Surface States of Semiconductor Nanocrystallites", *Physical Rev. Lett.*, vol. 76, No. 16, Apr. 15, 1996, pp. 2961–2964.

* cited by examiner

METHOD FOR PRODUCING SILICON NANOPARTICLES

REFERENCE TO RELATED APPLICATIONS

This application is related to and the following co-pending applications to Nayfeh et al:

Ser. No. 09/781,147, entitled SILICON NANOPARTICLE ELECTRONIC SWITCHES, filed on Feb. 9, 2001;

Ser. No. 09/572,121 entitled SILICON NANOPARTICLE MICROCRYSTAL NONLINEAR OPTICAL DEVICES, filed on May 17,2000

Ser. No. 09/496,506 entitled SILICON NANOPARTICLE FIELD EFFECT TRANSISTOR AND TRANSISTOR MEMORY DEVICE, filed on Feb. 2, 2000; and Ser. No. 09/426,204 entitled SILICON NANOPARTICLE STIMULATED EMISSION DEVICES, filed on Oct. 25, 1999.

The present invention generally concerns elemental silicon. A new and non-naturally occurring form of silicon is provided by the invention and has useful properties unlike bulk silicon or atomic silicon.

BACKGROUND OF THE INVENTION

Properties of silicon are generally understood by reference to atomic and bulk silicon models. Placed in this context, bulk silicon has evolved into a critical material in modern technology. The silicon transistor is widely appreciated as a revolutionary device. Quantum physics explains atomic silicon interactions. The understanding of bulk silicon, as well as atomic silicon, has limited the application of silicon to devices which benefit from the properties attributable to bulk and atomic silicon. Thus, when other properties are sought, such as stimulated emissions, other materials are used. Other materials, such as the Group III-V semiconductors are then used, despite the benign, plentiful and inexpensive nature of silicon. Expansion of the potential uses for silicon in electronic, optoelectric, biological and other diverse applications is therefore desirable.

Thus, there is a need for a new form of silicon. The invention provides such a new and non-naturally occurring form or phase of silicon and a method for producing it.

SUMMARY OF THE INVENTION

Highly uniform 1 nm silicon nanoparticles are provided by the invention. The nanoparticles exhibit beneficial properties. They are a source of stimulated emissions. They may be suspended in liquids, and solids. They can be formed into crystals, colloids and films. The nanoparticles of the invention are about 1 nm having about only one part in one thousand greater than 1 nm.

A method for producing the silicon nanoparticle of the invention is a gradual advancing electrochemical etch of bulk silicon. This may be followed by separation of nanoparticles from the surface of the silicon. Once separated, various methods may be employed to form plural nanoparticles into crystals, films and other desirable forms. The nanoparticles may also be coated or doped. The nanoparticles produced by the method of the invention are highly uniform in size. A very small percentage of significantly larger particles are produced, and such larger particles are easily filtered out.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIG. 12 plots the auto correlation function for the particle sample of FIG. 10a;

DETAILED DESCRIPTION OF THE INVENTION

Highly uniform 1 nm silicon nanoparticles are provided by the invention. The nanoparticles exhibit beneficial properties. They are a source of stimulated emissions. They may be suspended in liquids, and solids. They can be formed into crystals, colloids and films. The nanoparticles of the invention are about 1 nm having about only one part in one thousand greater than 1 nm. An individual silicon nanoparticle is dimensioned on an order of magnitude of one nanometer and not exceeding about 2 nanometers. The individual nanoparticle of the invention thus includes an order of magnitude of tens of silicon atoms, e.g., a 0.75 nanometer particle corresponds to about 10 silicon atoms, a 1 nanometer silicon particle corresponds to about 30 silicon atoms, a 1.4 nanometer particle corresponds to about 70 silicon atoms, and a 2 nm particle corresponds to about 200 silicon atoms.

The invention includes a method for converting silicon bulk crystals into individual silicon nanoparticles. The silicon nanoparticles may also be combined or reconstituted into crystals, solids, films, etc. The method for creating the nanoparticle of the invention is an electrochemical treatment which involves gradually advancing bulk silicon, e.g., a wafer, into a chemical etch bath at a low speed while etching is taking place, in the presence of an external current. A meniscus forms as a very thin slice of the silicon that is at the interface of etchant solution and air. The slow advance of the silicon creates a large section which is meniscus-like. In effect, a traveling meniscus is created as the silicon material is gradually advanced into the etchant bath while electrical current is applied. The process enriches the ultra small substructure of the material. Moreover, it makes the top skin of the silicon material extremely fragile. The ultra-small structures, which are silicon nanoparticles, may then be separated from the material and recovered.

Figure 1:
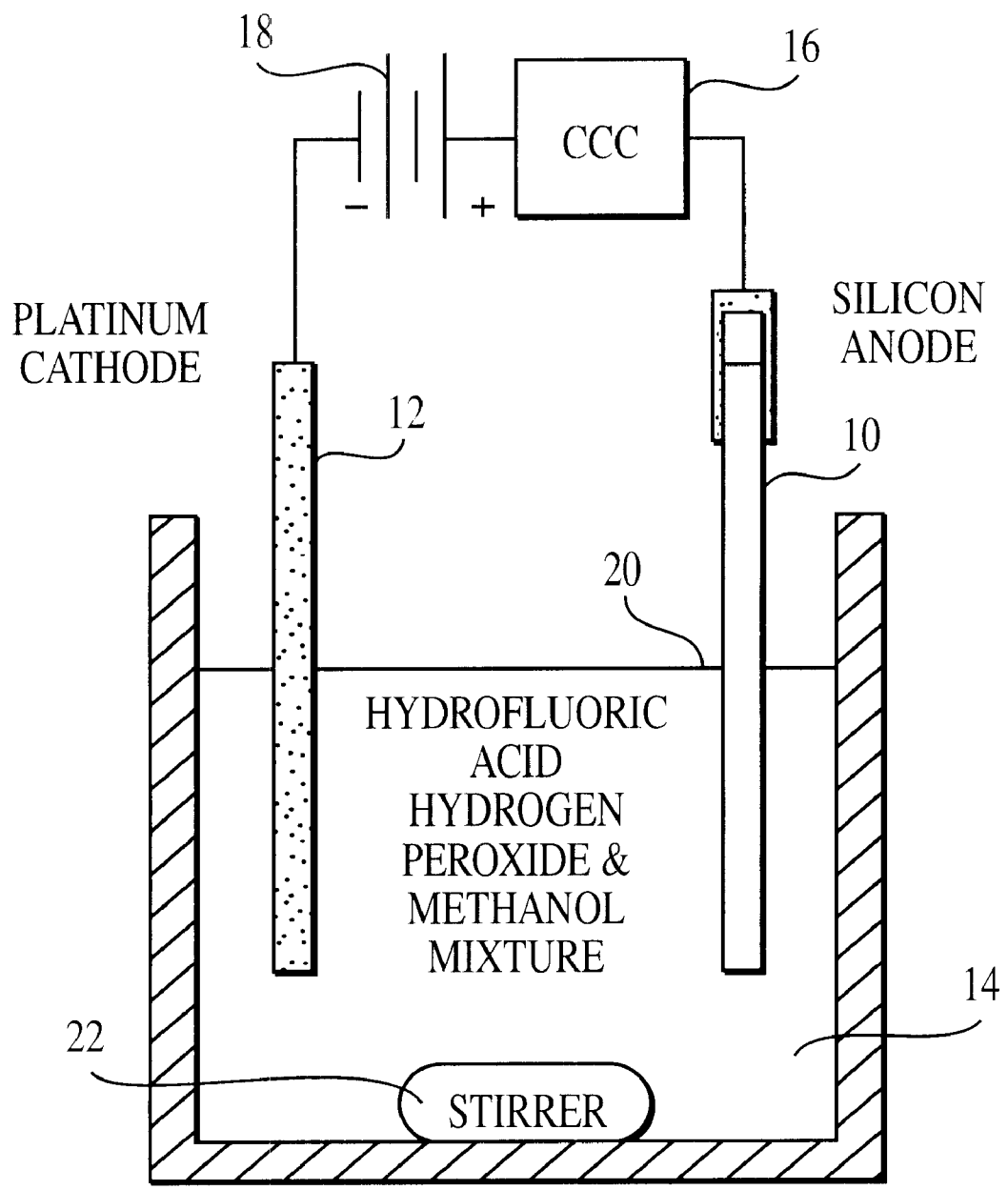
FIG. 1 illustrates the preferred method for producing silicon nanoparticles in accordance with the present invention.

A preferred embodiment of the method is illustrated in FIG. 1. The preferred embodiment uses a silicon single crystalline wafer 10, a platinum cathode 12 in the form of a sheet or a wire, HF acid, $H_2O_2$ liquid, and other chemicals that might include methanol or water for an etchant bath 14. The preferred silicon wafers are (100) or (111) oriented, 1–10 ohm-cm resistivity, p-type boron-doped silicon.

The wafer 10 and the cathode 12 are connected to a constant current source 16 driven by a power source 18. The cathode 12 is vertically or horizontally immersed in the etchant. The silicon wafer 10 is gradually advanced. By way of example, it has been found that a speed of about 1 mm per hour produces good results. As the silicon wafer 10 is gradually immersed into the solution, at a distance from the cathode 12, a meniscus forms at the point where the silicon wafer 10 is interfaced with a surface 20 of the etchant bath 14. While advancing the wafer, the current is maintained. By way of example, 15 mA has been found to produce good results. A magnetic stirrer 22 ensures that the chemicals of the etchant stay uniformly mixed. The meniscus travels along the silicon wafer 10 due to the gradual immersion and etches to create silicon nanoparticle structures on the top skin of the silicon material. By utilizing $H_2O_2$ (as a catalyst), and significant current, a high etching rate is realized which produces films of interconnected substructure with much reduced sizes, approaching the limit of size. Moreover, the lateral anodization creates a high current concentration in the top skin of the silicon wafer 10, hence the high etching rate leading to the ultra-small nanoparticle structures, especially at the meniscus (air-liquid interface). Advancing the sample in the etchant slowly and uniformly results in a large area of the sample that is meniscus-like, hence enriching the ultra small nano substructure.

Nanoparticles are then obtained by separating the silicon wafer 10 from the etchant bath 14, and separating the silicon nanoparticles from the surface of the silicon wafer 10. In the preferred method, the silicon wafer 10 is first removed from the etchant bath 14 and rinsed with methanol. In a large scale production of nanoparticles, it may be preferable to drain or move the etchant bath as a manner of separating the etchant bath 14 and silicon wafer 10. The silicon wafer 10 is then preferably immersed in an ultra sound acetone (ethanol, methanol or any other solvent) bath for a brief period of time. Under the ultra sound treatment, the very top layer of the silicon film on the wafer 10, a weakly interconnected luminescent nanostructure network crumbles into ultra small silicon nanoparticles, leaving behind a bottom layer of a deep red luminescent silicon nanoparticle material. This colloid is left to settle. Larger yellowish/orangish luminescent particles precipitate in a few hours, leaving behind a bluish luminescent colloid. Residual larger clusters with very low abundancy (1 part in one thousand) may remain in the colloid. Those can be separated by filtering the colloid using a commercial 200 nm filter, resulting in a highly uniform size distribution. The colloid is stable as it retain characteristic emission over weeks, indicating that the silicon nanoparticles are small enough to stay in suspension. Generally, any method which separates the silicon nanoparticles from the etched anode is suitable, but the solvent with breaking force supplied by ultrasound waves is preferred. Shaking, scraping or banging are exemplary, non-exhaustive, alternative techniques that may be used to break off the particles. The ultrasound appears to work best, though.

What is left of the silicon wafer 10 can be recycled (used as a source for creating additional nanoparticles) two to three times or even more depending upon its thickness. This cuts the cost of the raw material.

The silicon nanoparticles of the invention have good electronic, chemical and structural qualities. The preferred use of $H_2O_2$ as part of the etchant solution to produce the silicon nanoparticles provides a high quality hydrogen coating (termination or passivation), dominated by an ideal stretching mode with no di- or tri hydrides that act as nonradiative electronic traps. The high quality coating fully protects the silicon particles from uncontrollable low quality post interactions in the ambient atmosphere that would generate nonradiative traps. Moreover, the preferred etchant leaves no oxygen on the particles. After the electrochemical etching process is complete, the hydrogen coating, however, can be replaced by a high quality oxide coating by post immersion in $H_2O_2$. This is due to the fact that the high quality nature of the hydrogen termination makes it possible for hydrogen to be substituted with an ultra thin high quality oxide termination. This is a self-limiting process that yields oxide layers of 4 A thick on bulk Si, with a trap density of less than $\frac{1}{10}^{14}$. The oxide coating provides additional protection and hardening against laser damage. The optical properties of the silicon nanoparticles are not compromised by such a high quality oxide termination (passivation). As to the chemical quality, $H_2O_2$ is an oxidant which will remove nearly every kind of contamination (organic material, metals, alkalines, and metal hydroxides) from silicon surfaces by oxidative dissolution and complex formation.

Figure 2:
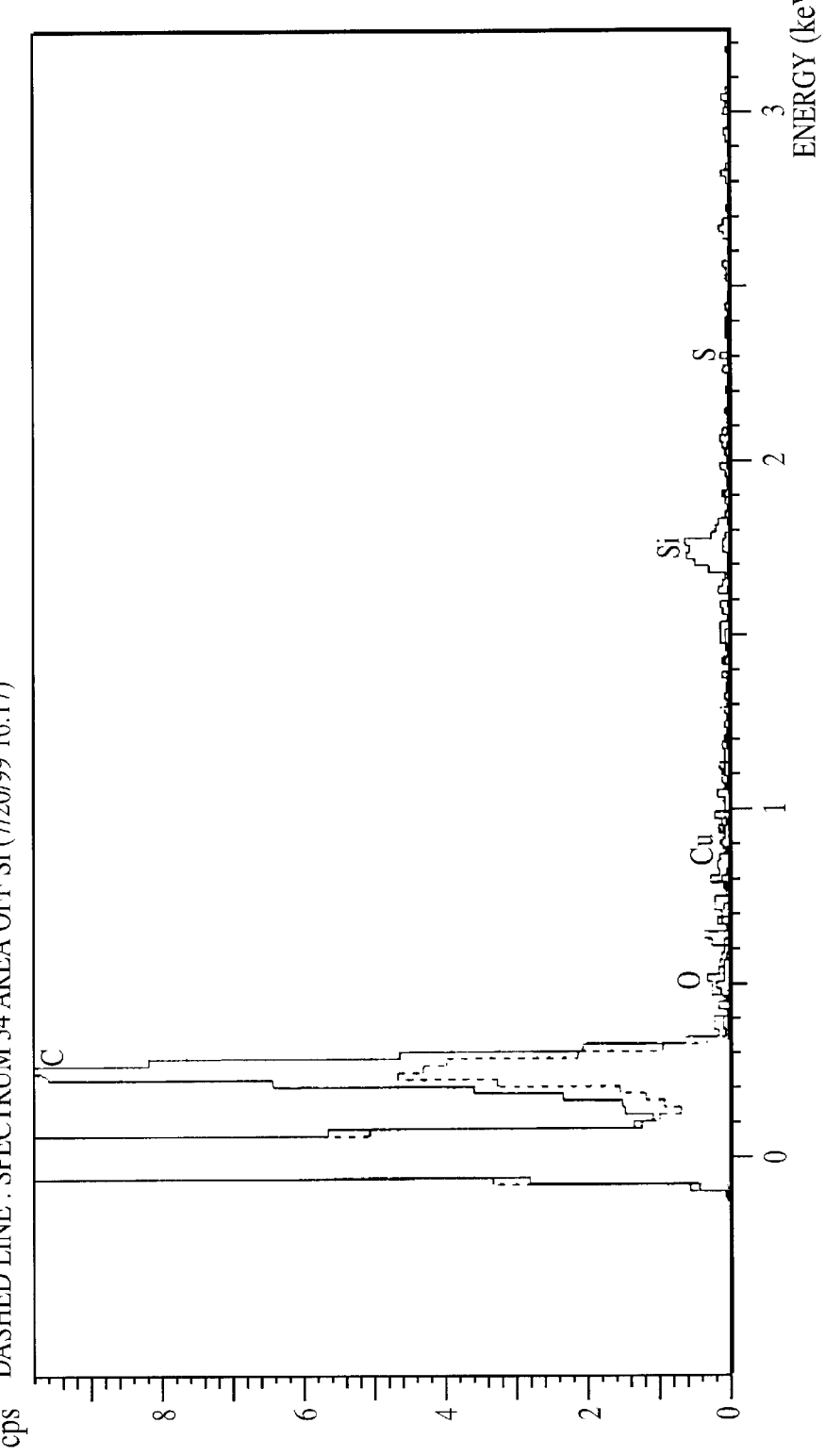
FIG. 2 is a material analysis profile of silicon nanoparticles of the invention obtained by electron photospectroscopy.

Material analysis profiles were recorded using electron photospectroscopy. Since the electron beam focuses to a spot of less than 1.5 nm, individual ultra small silicon nanoparticles were targeted for material analysis. FIG. 2 shows that the nanoparticles are composed of silicon with no oxygen present. Prior to separation, Fourier transform infrared spectroscopy (FTIR) shows that the silicon nanoparticles on the surface of the wafer 10 have no oxygen as it shows only stretching monohydrides Si—H (at 2083.7 cm-1) and coupled H—Si—Si—H, i.e., Si—Si dimmers due to reconstruction.

A typical silicon nanoparticle colloid density is 30 nano molar, corresponding to $3 \times 10^{13}/cm^3$. But the material may be concentrated by evaporation of the volatile solvent.

The silicon nanoparticles may be further processed by manipulation of their nano surface. An oxide coating may be applied, for example, as discussed above. Immersion in $H_2O_2$, after the etching process is complete but either before or after the separation step will accomplish an oxide coating. Immersion for a sufficient time (45 minutes to an hour has been found suitable) allows $H_2O_2$ to remove hydrogen coating produced by the etchant and replaces it with a high quality oxide coating, one monolayer thick with very little increase in size, and without appreciable reduction in blue emission efficiency of the nanoparticles.

Alternative coatings are also possible. The silicon nanoparticles have application as an alternative markers to dyes used in biological applications since even a single particle can be detected due to its emissions in response to stimulations. In such biological applications, it may be desirable to coat the silicon nanoparticles with biological material. Such coatings can be chosen to selectively control their attachment to components within an organism, cell or to biological molecules.

Emission characteristics of the silicon nanoparticles of the invention may be tailored by doping to tune the emission bands. As an example, doping with aluminum shifts emission into the blue direction, whereas doping with erbium produces intense infrared radiation at 1.54 μm. Doping may be accomplished by a slight alteration of the above described method for producing the silicon nanoparticles. Precursor salts that bear the dopant are prepared in an aqueous solution. Before separation of the silicon nanoparticles from the silicon anode 10, the etchant solution 14 is drained and replaced by the salt solution. Alternatively, the anode 10 may be removed and placed in the salt solution. Electrodes 10, 12 are then biased to draw the dopant ions towards the silicon wafer anode 10. The dopant may alternatively be implanted by ion bombardment. After deposition or ion implantation, the silicon wafer anode 10 is heat treated in an inert atmosphere to drive the dopant into the material. Once this is achieved, the doped silicon nanoparticles may be separated from the anode and collected, as described above.

Molding of the silicon nanoparticles produces geometry of choice. A paste of individual silicon nanoparticles may be prepared. The silicon nanoparticles may also be placed in a matrix of choice to form a thin film, or molded in any geometry or shape, or they may be implanted in material mix during manufacturing as an invisible label. Precipitation of the colloid silicon nanoparticles from a volatile solvent such as acetone, ethanol or methanol can be used to prepare thin films or superlattices on a substrate of choice, such as device quality silicon used in electronic and electrooptic devices. Nanoparticle colloids may also be solidified by applying an electric field to the disordered fluid. Silicon nanoparticles take only milliseconds to form long blue luminescent "pearl" chains. A few seconds later, the chains aggregate into blue luminescent columns.

The emission characteristics of the undoped silicon nanoparticles of the invention are unlike those of bulk silicon, which is highly inefficient. Upon irradiation with 355 nm UV radiation, emission from a silicon nanoparticle colloid of the invention is found to encompass a spectrum from 920 to 390 nm. The emission intensity is dominated by an extremely strong deep blue band centered at 390 nm, with a structureless weak orange/red tail (690–490 nm), and a weak infrared band centered at 760 nm.

Figure 3:
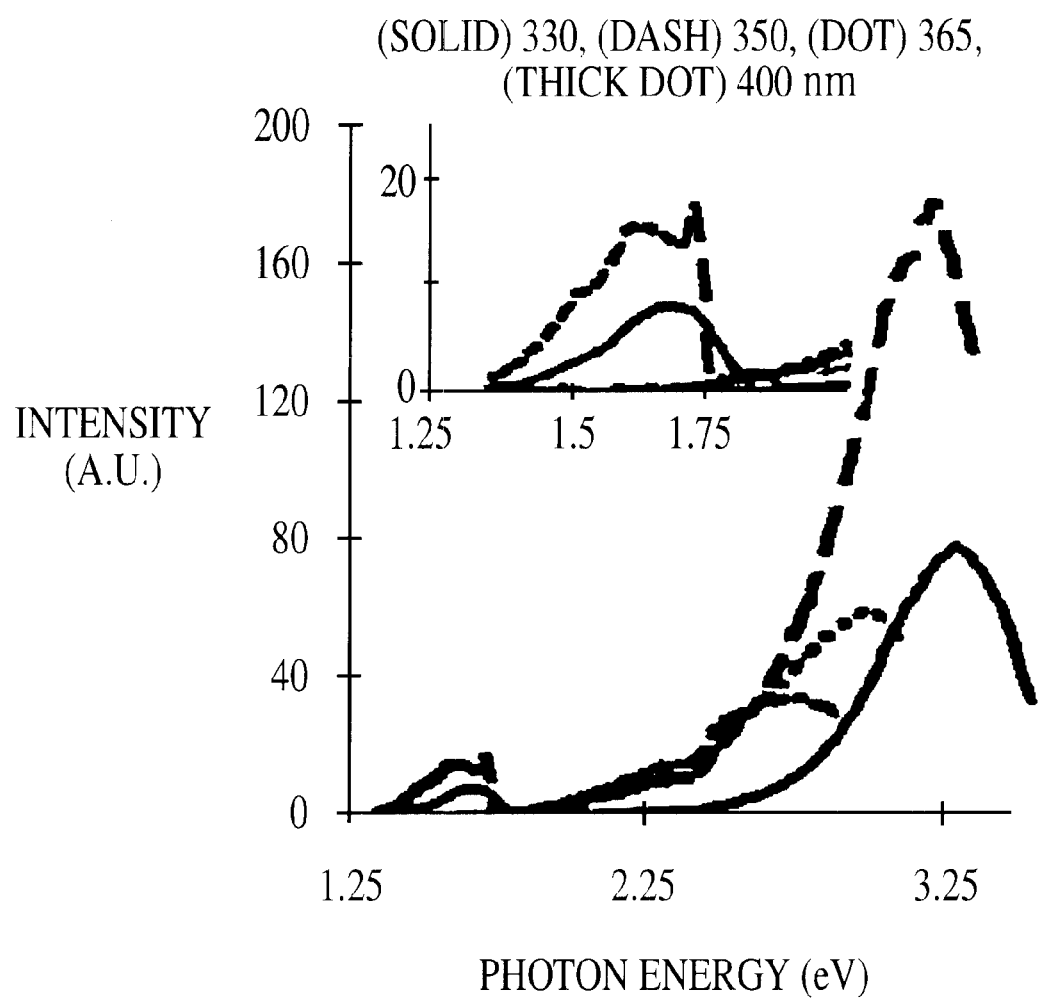
FIG. 3 gives the emission spectrum of dispersed silicon nanoparticles and illustrates its development with the excitation wavelength at 330, 350, 365, and 400 nm.

Luminescence was recorded on a photon counting spectro-fluorometer with a arc lamp light source and 4 nm bandpass excitation and emission monochrometers, with suitable filtering and correction for spectral response. The emission detector has a cut off wavelength at 950 nm. FIG. 3 gives the emission spectrum of dispersed silicon nanoparticles and illustrates its development with the excitation wavelength at 330, 350, 365, and 400 nm. Each of the spectra encompasses the visible spectrum but is dominated by a strong blue band with a structureless weak red/orange tail, and a weak infrared band.

Consider the blue band first. For excitation at 330 nm, the blue band peaks at 376 nm. As the wavelength of excitation is increased from 330 nm, the blue band shifts to 387, 415, and 455 nm for excitation at 350, 365, and 400 nm respectively, i.e., the peak of the emission energy correlates with the excitation photon energy. For 330 nm, the infrared band peaks at 730 nm and red shifts with the excitation wavelength as in blue band. As to the quantum efficiency, the blue band maximizes for excitation at 350 nm. For 450 nm (not shown), the efficiency of the blue band drops by two orders of magnitude. On the other hand, no infrared response is seen for excitation at 365, 400, and 450 (not shown) nm. There is some instrument infrared background in this portion of the spectrum which was subtracted out from the spectra of FIG. 3.

Figure 4:
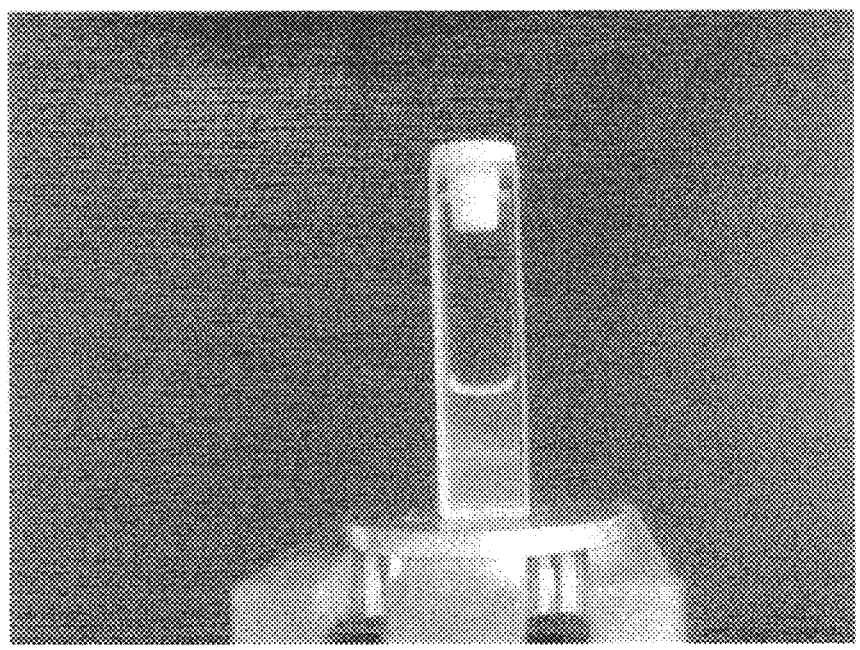
FIG. 4 is a photograph showing a visible blue emission from a dispersed liquid colloid of silicon nanoparticles.

When the liquid colloid of suspended silicon nanoparticles is excited by the third harmonic of an Nd-Yag laser at 355 nm, 30 ns pulse duration, and 10 pulses per second repetition rate, the blue emission is observable with the naked eye, in room fight. A photograph of the emission under these conditions is shown in FIG. 4, where a sharp horizontal line of blue emissions is readily apparent.

Figure 5:
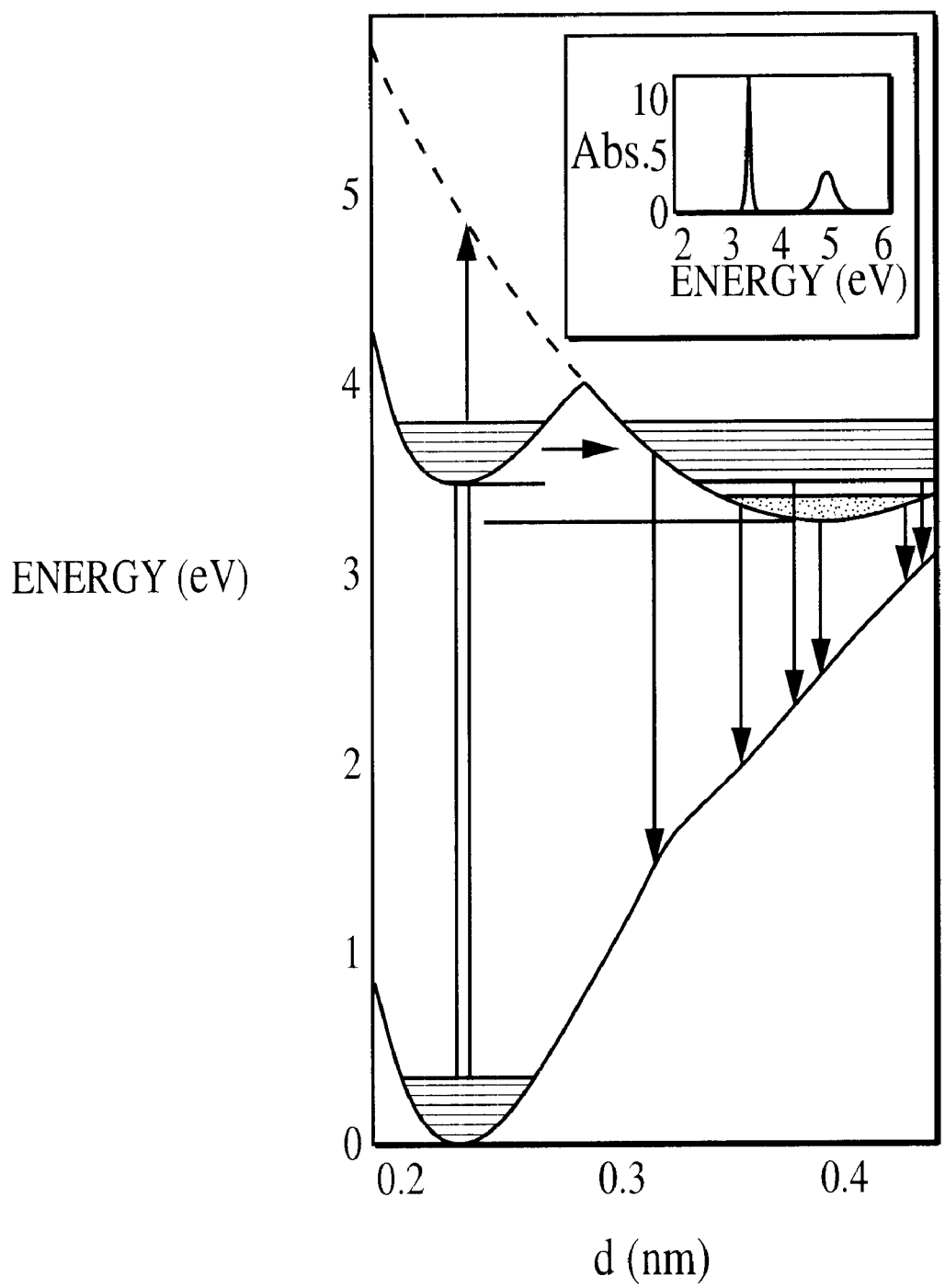
FIG. 5 plots interatomic potential of the ground and excited electronic states of a Si—Si phase on the silicon nanoparticles.

From calculations, the emission intensity of the silicon nanoparticles is predicted by recombination of electron-hole pairs, excited by the incident radiation, on Si—Si bonds that form on the surface of ultra-small nano particles. FIG. 5 depicts the interatomic energy potential of the bond as a function of bond length in the electronic ground and first excited states. Emission is expected to emanate from the outer potential of the excited state. It is predicted to span a wide range of the visible and near infrared portions of the spectrum since emission can take place over a wide range of bond length. However, the emission intensity is expected to be proportional to the time the bond stays at a given length, i.e., inversely proportional to the slope of the potential difference of the ground and excited states. Thus, one expects an emission band from the bottom of the outer well (at ~3.84 A) and a band from the region near the top of the barrier (at ~3.0 A), producing infrared and blue bands respectively. For bond length between the top of the barrier and the bottom of the well, the slope is finite and nearly constant, thus we expect structureless but weaker emission since the system stays the least time in this region. For a 1.03 nm particle, the bands are expected to be in the range ~1.5 to 0.5 eV, and in the range 2.6 to 3.2 eV.

There is also evidence of radiative states based on a potential barrier seen in FIG. 5. The evidence has been derived from the manipulation of the nanoboundary by high quality ultra thin oxides or conductors. The states can only exist in ultra-small particles, as accessed by the method for producing the nanoparticles of the invention.

Figure 6:
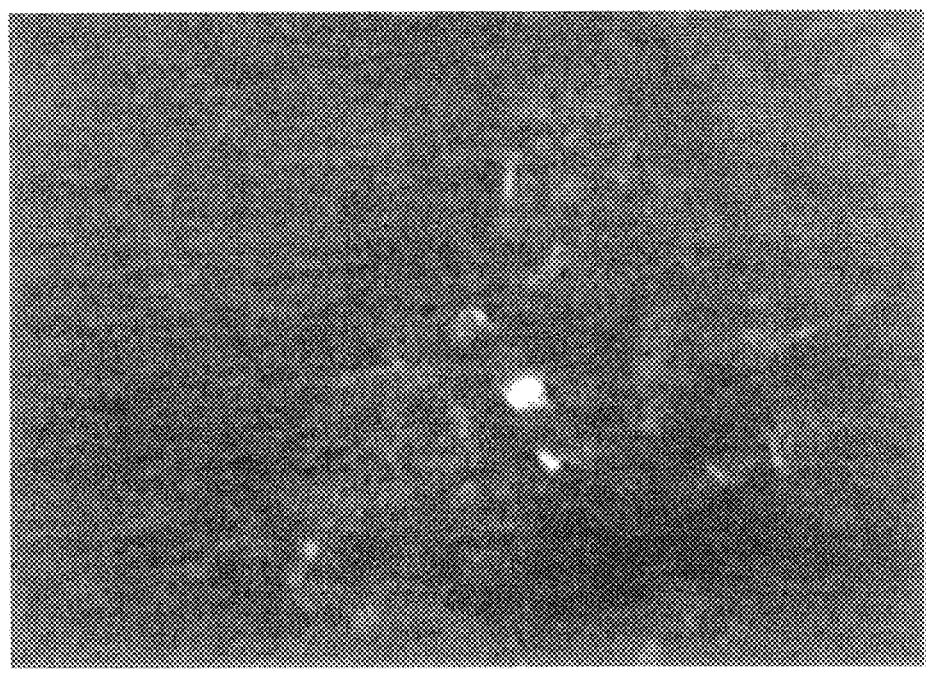
FIG. 6 is an example of emission from a cluster of silicon nanoparticles on a device quality silicon substrate.
Figure 7A:
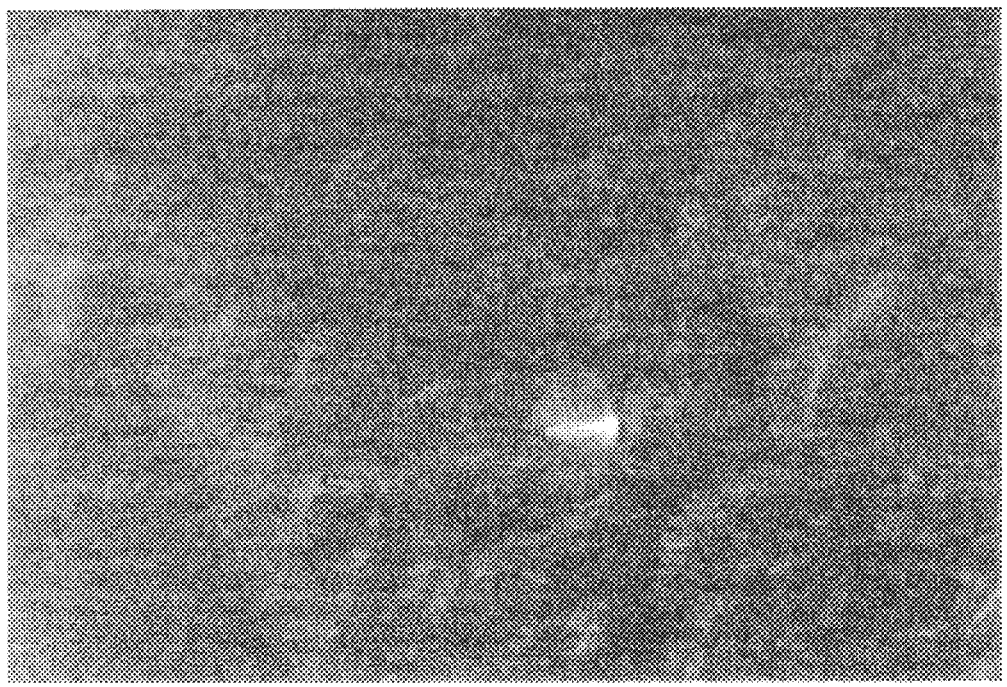
FIGS. 7a and 7b display stimulated directed blue beam emissions within the walls of a microcrystallite reconstituted from the silicon nanoparticles.
Figure 7B:

The geometry and end form of nanoparticles results in different types of emissions. The liquid colloid of FIG. 4 produces a non directed emission. FIG. 6 is an image of stimulated solid particle clusters of silicon nanoparticles formed on a thin film by precipitation. The emission is nondirected. FIGS. 7a and 7b show the visible and directed emission response of a micro crystallite formed from silicon nanoparticles by precipitation. This demonstrates a distinct narrow beam of light emission being directed from one micro crystallite face to another.

The stimulation in each case herein was irradiation, but electrical stimulation is expected to produce similar results. When an electron of sufficient energy strikes the silicon nanoparticle, electron hole-pairs can be excited. Once the excitation is accomplished, the remaining portion of the process, namely trapping, and radiative recombination is the same as in photo simulation, resulting in what is called electro luminescence. Electron-excitation cross sections and nonradiative capture, and electric conductivity must be calculated and measured to make reliable estimates of the efficiency of devices based on this concept. Another potential source of excitation is an electron beam from a near field optical microscope.

Figure 8:
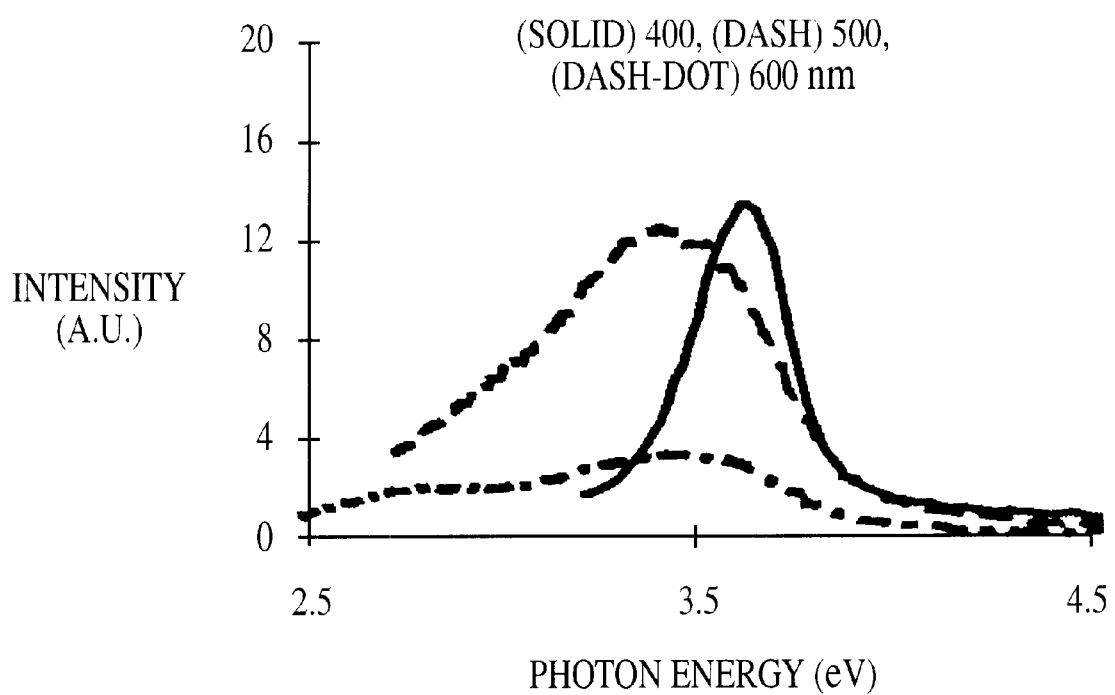
FIG. 8 plots the excitation spectra of the dispersed silicon nanoparticles while monitoring the emission at several selected visible wavelengths within the emission spectrum.

Excitation spectra were also recorded for suspended dispersed nanoparticles. Excitation spectra, which consist of recording the luminescence intensity as a function of excitation energy for a given emission wavelength essentially measure a product of two factors: the efficiency of exciting electron-hole pairs at a given photon energy; and the probability of those pairs to relax into states from which emission at the chosen wavelength can occur (quantum efficiency). FIG. 8 gives the excitation spectra of the dispersed silicon nanoparticle colloid while monitoring the emission at several selected visible wavelengths within the emission spectrum. The response at 500, 600, 530 (not shown) and 660 nm (not shown) show an excitation band extending from 2.5 eV to ~4 eV with a maximum near 3.5 eV. The response at 400 nm is narrower with a maximum at 3.6 eV.

Figure 9:
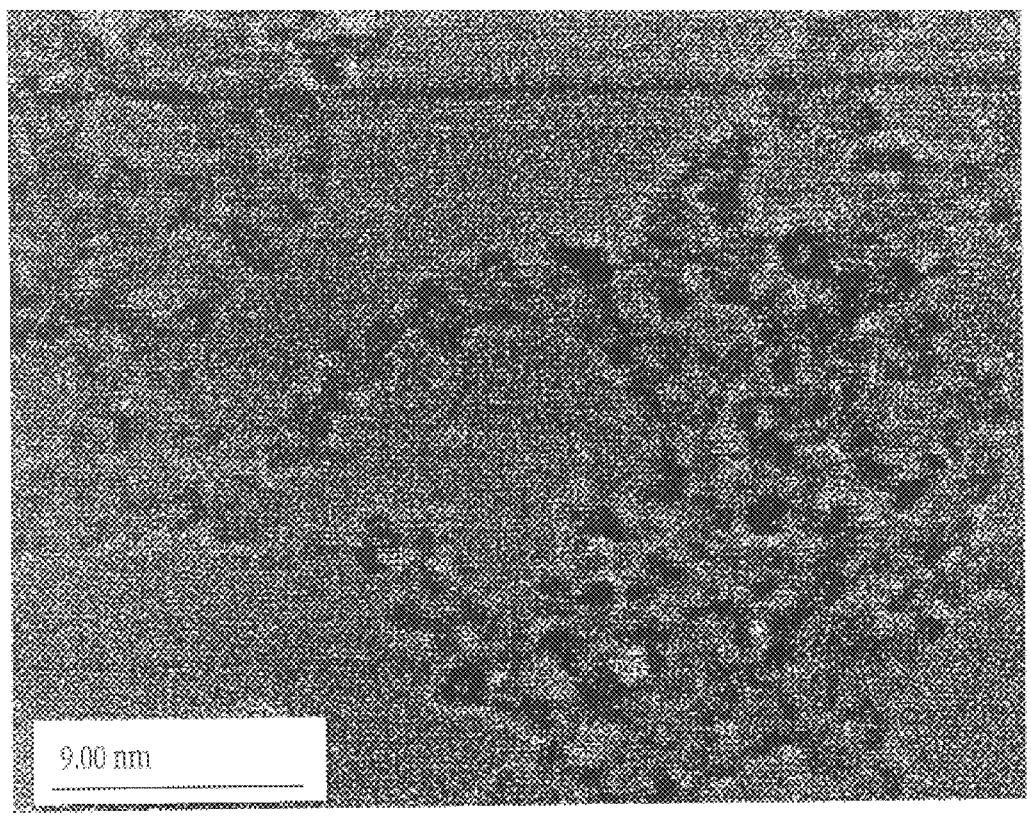
FIG. 9 is an electron microscopy image of the silicon nanoparticles.

The size of the silicon nanoparticles of the invention was determined by direct imaging using high resolution transmission electron microscopy. A thin graphite grid was coated with the silicon nanoparticles by immersion in the colloid. FIG. 9, an electron microscopy image of the silicon nanoparticles, shows that most of the silicon nanoparticles are 1 nm in diameter, with a small percentage in the range 1–3 nm.

Applications of the Present Silicon Nanoparticles
Biological Applications

Many applications of the present silicon nanoparticles will be apparent to artisans. For example, a particle size and quantum efficiency comparison with Flurocein Dyes reveals that the particles, and even single individual particles, can form a substitute for such dyes in biological testing. The dispersed silicon nanoparticles of the invention have very high quantum efficiency, such that it is possible to signal, using auto correlation fluctuation spectroscopy (FCS), the photoluminescence from a few particles in the laser interaction volume (of one pico cubic centimeter) including a single particle. The measurements show that the particle's diffusion, size, and excitation efficiency are comparable to those of the fluorescein dye molecule, one of the top efficient dyes in the blue.

Figure 10A:
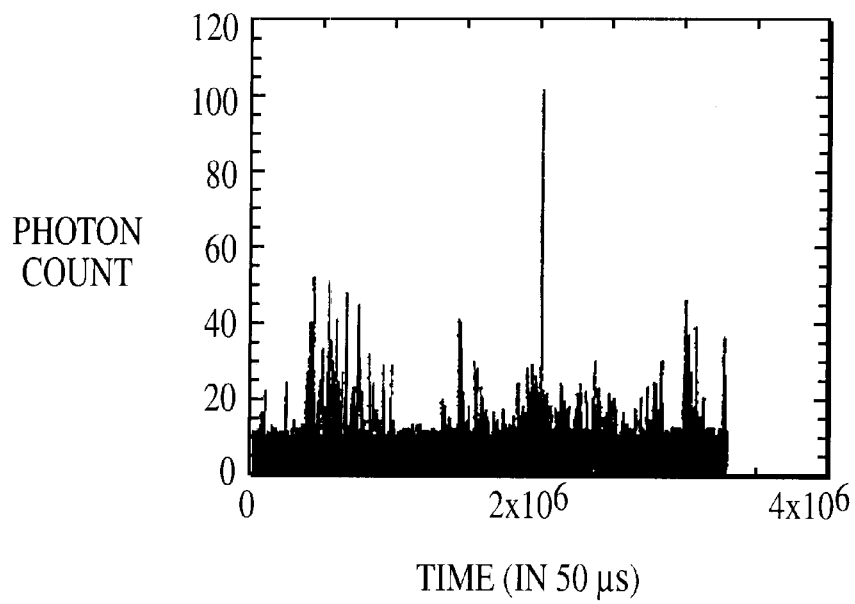
FIGS. 10a–b respectively give the raw traces (photon counts per time) of emission of a Si particle sample and a fluorescein standard, taken at an average intensity of $10^6$ W/cm$^2$ at 780 nm (390 nm effective two photon absorbtion), under the same beam focusing conditions.
Figure 10B:
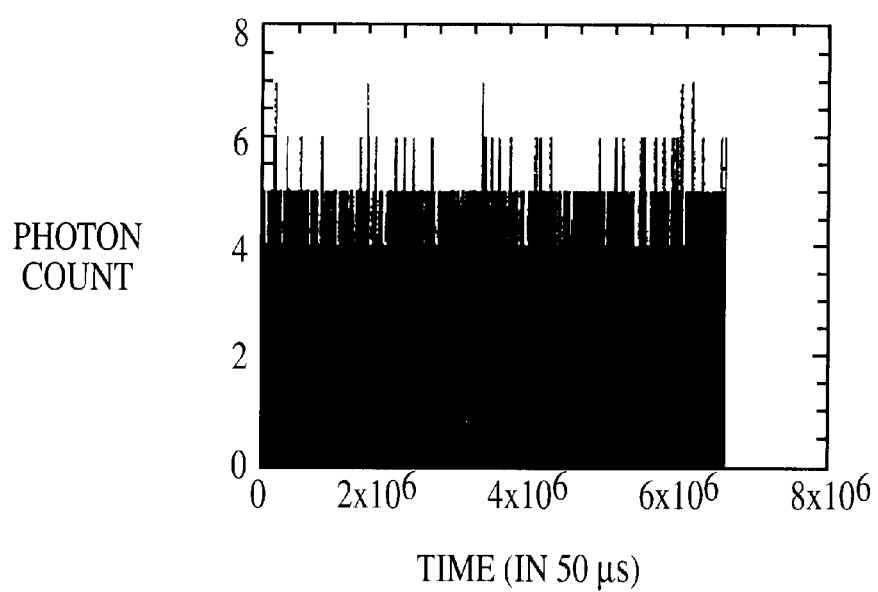
Figure 11A:
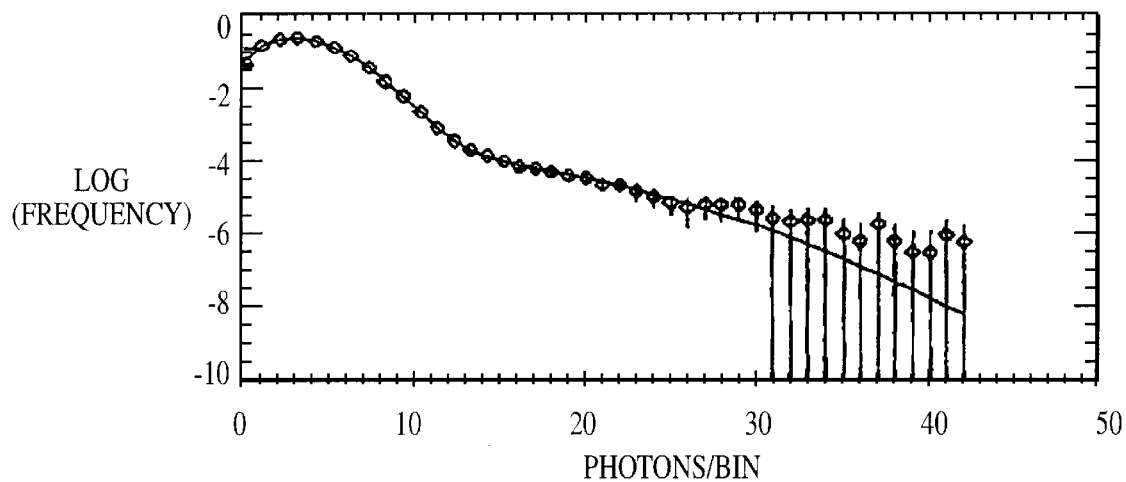
FIGS. 11a and 11b plot the respective photon count histogram (photon counts vs. photons) of a silicon particle colloid and a fluorescein dye sample.
Figure 11B:
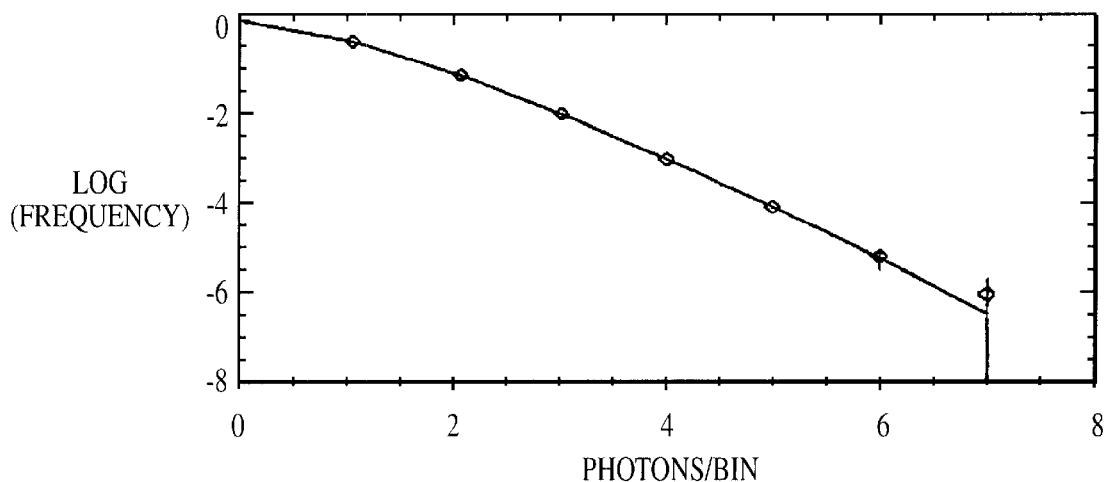

FIGS. 10a and 10b respectively give the raw traces (photon counts per time) of emission of a Si particle sample and a fluorescein standard, taken at an average intensity of $10^6$ W/cm$^2$ at 780 nm (390 nm effective two photon absorbtion), under the same beam focusing conditions. Fluorescein absorbs in the range 325 to 430 nm and emits in the range 450 to 600 nm. On the other hand the particles absorb in the range 300 to 400 nm with a maximum response at 355 nm and emit in the range 390 to 460, with a maximum response at 390 nm. Unlike fluorescein, the particle traces show a small number of events that are exceedingly higher than the average rate. Analysis of the photon count histogram (frequency vs. photon counts) given in FIG. 11a shows that the majority of the events average to a brightness $\epsilon_1$ less than one, with the number of particles in the focal volume at any time $N_1$ is ~30 particles. But a small fraction $N_2/N_1 \sim 10^{-3}$ has an average brightness $\epsilon_2$ as large as 50. The analysis gives one component for fluorescein as expected in FIG. 11b.

Figure 12:
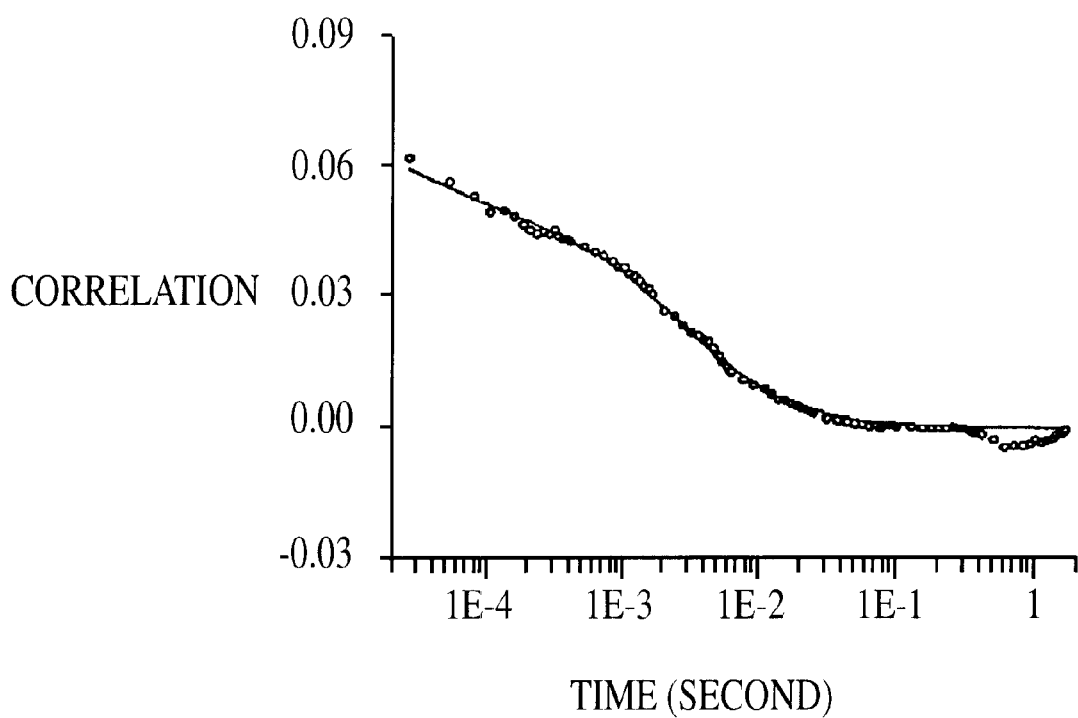

FIG. 12 gives the auto correlation function of the luminescence $\int I(t+\tau)I(t)^* dt$ for the particle sample of FIG. 10a. We assume a Gaussian beam profile and quadratic absorption dependence. For the total average yield, the measured power dependence is quadratic. The correlation function is fitted to a two component Gaussian diffusion function: $A_1(1/(1+8D_1 t/w^2)) \times SQRT(1/(1+8D_1 t/z^2)) + A_2(1/(1+8D_2 t/w^2)) \times SQRT(1/(1+8D_2 t/z^2)) + B$, where w is the width of the beam, z is the height of the focal volume, t is in millisecond, I is the total average brightness, B is an offset, $A_1 = 0.076 N_1(\epsilon_1/I)^2$, and $N_1$, $\epsilon_1$ and $D_1$ are the number of particles in the focal volume, brightness and diffusion coefficient of the majority particle, and 0.076 is a numerical calibration factor from the fluorescein measurements. We included the second Gaussian as a small contribution from the second component, with $A_2 \ll A_1$ taking a corresponding expression in terms of the parameters of the minority. From the response of fluorescein (for known density and diffusion coefficient), taken under the same beam focusing conditions, we get w=300 nm and z=2.5 $\mu$m, or a volume of 0.68 pico cubic centimeters. A self consistent analysis of the histogram and the auto correlation spectra gives $N_1$=29, $\epsilon_1$=0.12, $D_1$=9.5×10$^{-6}$ cm$^2$/s for the majority component, and $N_2/N_1$= 8.6×10$^{-4}$, $\epsilon_1$=51, $D_2$=11.4×10$^{-8}$ cm$^2$/s for the minority component.

Figure 13A:
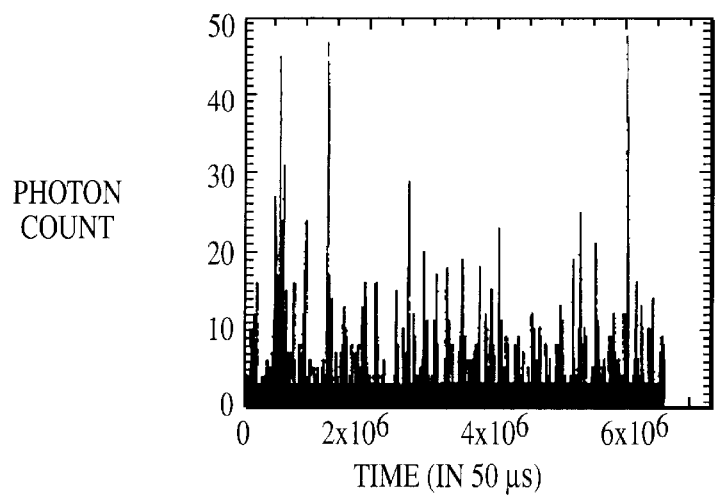
FIGS. 13a–c give the raw traces of samples before filtering, after filtering through a 200 nm filter, and after filtering through a 10 nm filter, respectively.
Figure 13B:
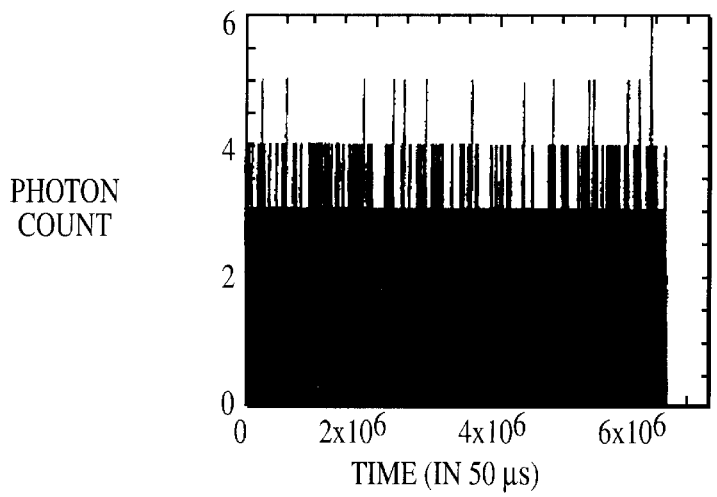
Figure 13C:
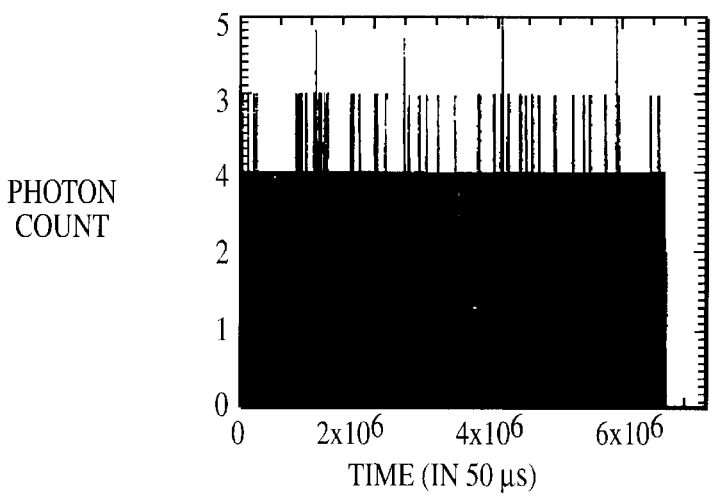

Using the Stokes-Einstein relation, d=kT/3$\pi$D where T=300°, the viscosity $\eta$=10$^{-3}$ kg/m-s and k is the Boltzman constant, gives 0.9 nm and 80 nm for d, the diameter of the particles of the two components. The brighter events appear to pertain to a larger entity, two orders of magnitude larger than the small particles. The size of the majority is consistent with direct imaging using high resolution transmission electron microscopy. Although the fitting procedure is reasonably accurate, we filtered the sample to get rid of the larger entities, to simplify the analysis. FIGS. 13a–c respectively give the raw traces of samples before filtering, after filtering through a 200 nm filter, and after filtering through a 10 nm filter, showing that the brightest events are dramatically reduced, thus confirming that these events belong to large entities. It is not clear whether the filter stopped the larger solid entities or simply broke up larger clusters. Since the larger entities are very bright we believe that they were actually clusters comprised of smaller luminescent nanoparticles.

Figure 14A:
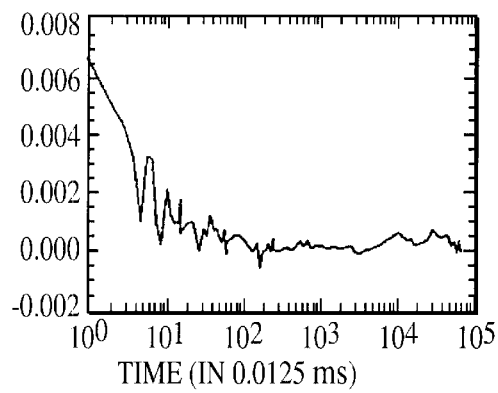
FIG. 14a shows the auto correlation function of a filtered nanoparticle sample with 5.4 silicon nanoparticles on the average in the focal volume of the incident beam.
Figure 14B:
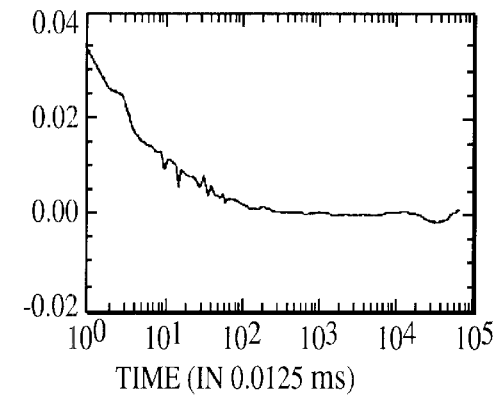
FIG. 14b of a fluorescein sample diluted enough to have about 1.5 molecules on the average in the focal volume.

We next recorded the raw emission traces and the photon count histogram, and calculated the auto correlation functions for a filtered sample and a 10 nano molar fluorescein standard under the same beam conditions for reference. FIG. 14a shows the auto correlation function of a filtered nanoparticle sample with 5.4 silicon nanoparticles on the average in the focal volume of the incident beam; FIG. 14b of a fluorescein sample diluted enough to have about 1.5 molecules on the average in the focal volume. A self consistent analysis of FIGS. 14a–b with the nanoparticle response (FIG. 14a) being fitted to a single species, i.e., taking $A_2$=0 gives 5.415 particles and 1.443 fluorescein molecules (FIG. 14b) in the focal volume, and a corresponding luminosity of 0.07 and 0.15.

Figure 14C:
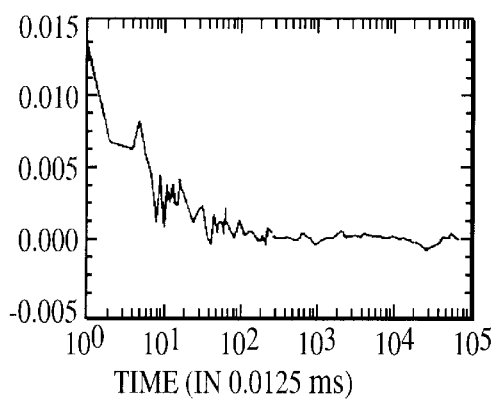
FIG. 14c from a diluted filtered silicon nanoparticle sample with 2.7 silicon nanoparticles in the focal volume; and, FIG. 14d from a filtered silicon nanoparticle sample diluted by a factor of five to have less than a single particle (0.78) on the average in the interaction volume.
Figure 14D:
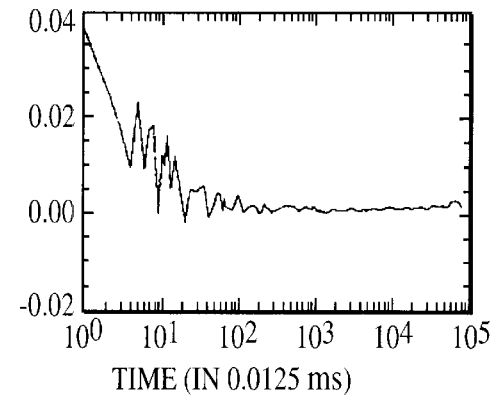

The count rate of the background using a blank solvent is 200 counts/s, only 3 percent of 6,500 counts/s, the count rate per a silicon nanoparticle. With this signal to noise ratio, one can signal dilute enough samples such that only one nanoparticle or less is found in the focal volume at any time. To get down to the single particle level, we diluted the above sample by a factor of ~2 and by a factor of ~5. Again, we recorded the raw emission traces and the photon count histogram, and calculated the correlation functions. A self consistent analysis of FIG. 14c gives 2.765 particles for the dilution by a factor of two. The dilution by a factor of ~five (FIG. 14d) gives 0.7868 particles, that is less than a single particle in the interaction volume. The analysis gives a luminosity of 0.083 and 0.081 respectively. When normalized the autocorrelation functions of the fluorescein (FIG. 14b) and the particle samples (FIGS. 14a, 14c, and 14d) show comparable correlation, hence similar diffusion coefficient and size. Fluorescein molecules have a planar molecular structure of 8×8 atomic bonds (less than 1 nm across).

The excitation efficiency of the ultra-small Si nanoparticles may now be defined in terms of that of fluorescein at the same beam conditions. The quantum efficiency of fluorescein (emission efficiency per photon absorbed), one of the top efficient green dyes, has been known to be the most reliable as a standard; it is established at 90±5%. The excitation efficiency presented here, however, is not the quantum efficiency, rather it is the product of absorption and quantum efficiencies. Using 0.078, the average luminosity of the three measurements of the filtered silicon nanoparticle samples and its dilutions from FIGS. 14a, c, d gives an excitation efficiency 52 percent of that of the fluorescein standard (0.16). It is also to be noted that the excitation and detection in these measurements are not optimized for the silicon nanoparticles, rather they are skewed in favor of fluorescein. Thus, the particle excitation efficiency is expected to increase for excitation at shorter wavelengths near its maximum response at 710 nm (by a factor of four). Moreover, it is also expected to improve further, upgrading the particle efficiency to two-to-threefold of that of fluorescin, if the data is corrected for the detector efficiency.

The benign nature of silicon compared to the dyes, and the ability to coat the nanoparticles with biological material suggests the replacement of dyes with nanoparticles for biological marking.

Coatings can be used to control nanoparticle attachment in biological marking. The silica surface of the nanoparticles can be modified by certain coatings to selectively control its attachment to components within a cell. For example, oxide shells can be coated with trimethoxysilylpropyl urea and acetate groups. Such groups bind the nanocrystallite with high affinity to the cell nucleus. On the other hand, incubating the nanocrystallites in a sodium dodecylsulfate soap solution (SDS) suppresses the nuclear binding. Biotin can also be covalently bound to the oxide shell of the nanocrystallite surface. These may not attach themselves to fibroblasts unless they were incubated in phalloidin-biotin and streptavidin. Nanoparticles may be labeled with protein transferrin. Those undergo receptor-mediated endocytosis in cultured HeLa cells. They may also be labeled with immunomolecules which recognize specific antibodies or antigens. Covalent coupling to biomolecules provide ultrasensitive biological detection. Coating heptane and organoamines such as n-butyl amine C4H9NH2 are very useful. These amines act as efficient electron donors (Lewis base) and may act as a simple hole trap, or quencher of luminescence or as quenching labels. Control of size should also control the nanoparticles attachment to components within a cell, as it does with other markers.

Electronics and Optoelectronics

Optoelectronics is a field for which the silicon nanoparticles of the invention has clear application. Assembly of Si particles on device quality silicon crystals provides a direct method of integrating luminescent superlattices into existing microelectronics architecture, opening applications in low-power electronics (atomic electronics, single electron transistors), sensitive detection such as high sensitivity electrometers, nonvolatile floating gate memory, or in optoelectric applications such as in display or interconnect applications.

Figure 15A:
FIG. 15a is an optical microscope image of faceted colloidal silicon nanoparticle crystals of 5 to 50 μm in size.
Figure 15B:
FIG. 15b is an image showing a region where clusters have formed.
Figure 15C:
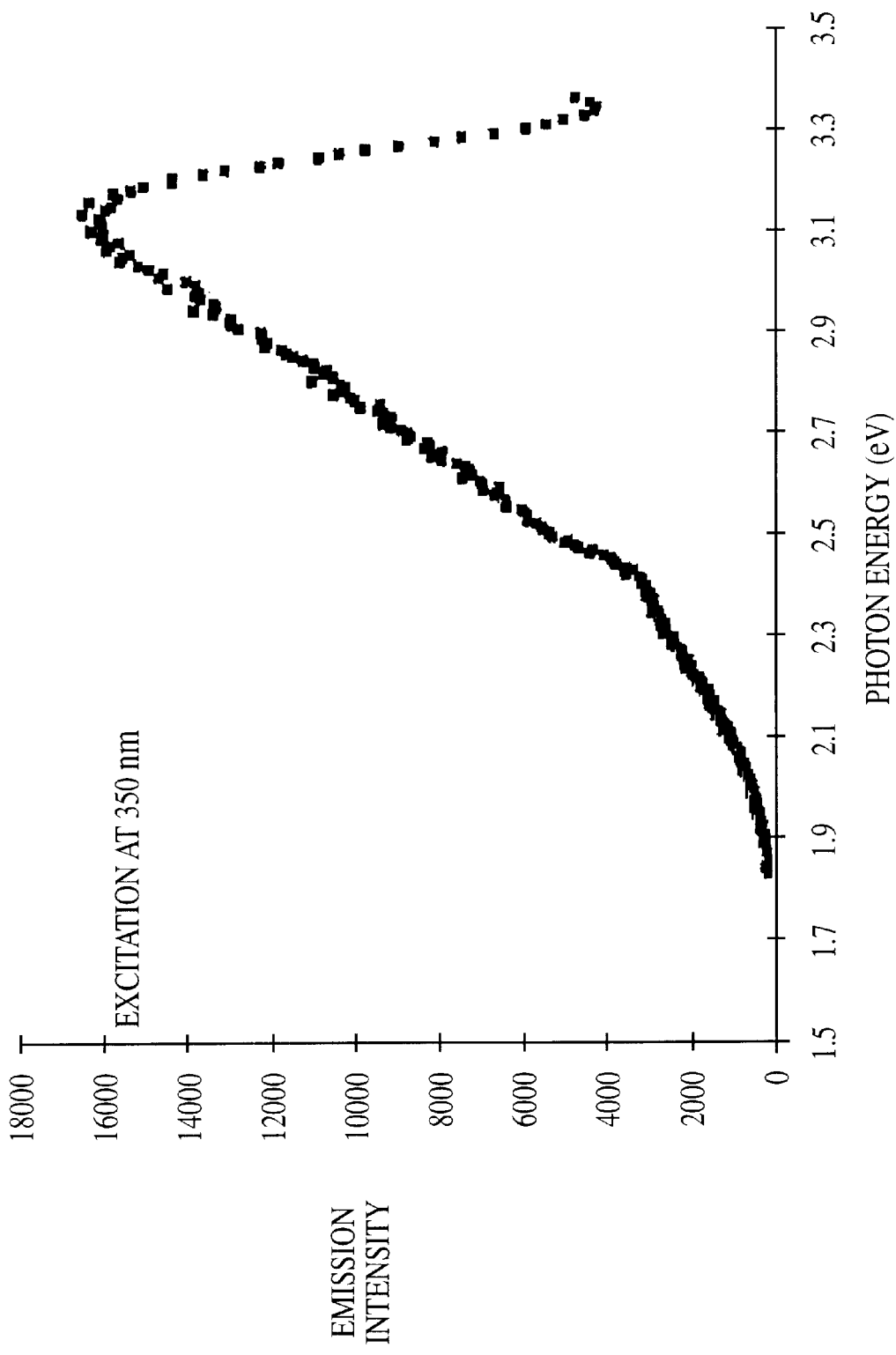
FIG. 15c plots emission spectra from a film of silicon nanoparticles.

An exemplary method to prepare such a film was demonstrated by precipitation of the colloid particles from a volatile solvent (acetone) to prepare a thin film on a substrate of silicon. The precipitation did not compromise the optical activity of the silicon nanoparticles. The silicon nanoparticles in the film continue to be fluorescent in the blue. With an optical microscope, we observed the substrate using white light. It shows faceted colloidal crystals of 5 to 50 $\mu$m in size as seen in FIG. 15a. FIG. 15b gives an example where clusters of particles have formed. FIG. 15c gives the emission spectra from a film of silicon nanoparticles, confirming the blue emission of the film. If precipitation is carried out using a low density colloid, the film will not exhibit faceted recrystallization, rather a uniform layer of the nanoparticles.

Figure 16:
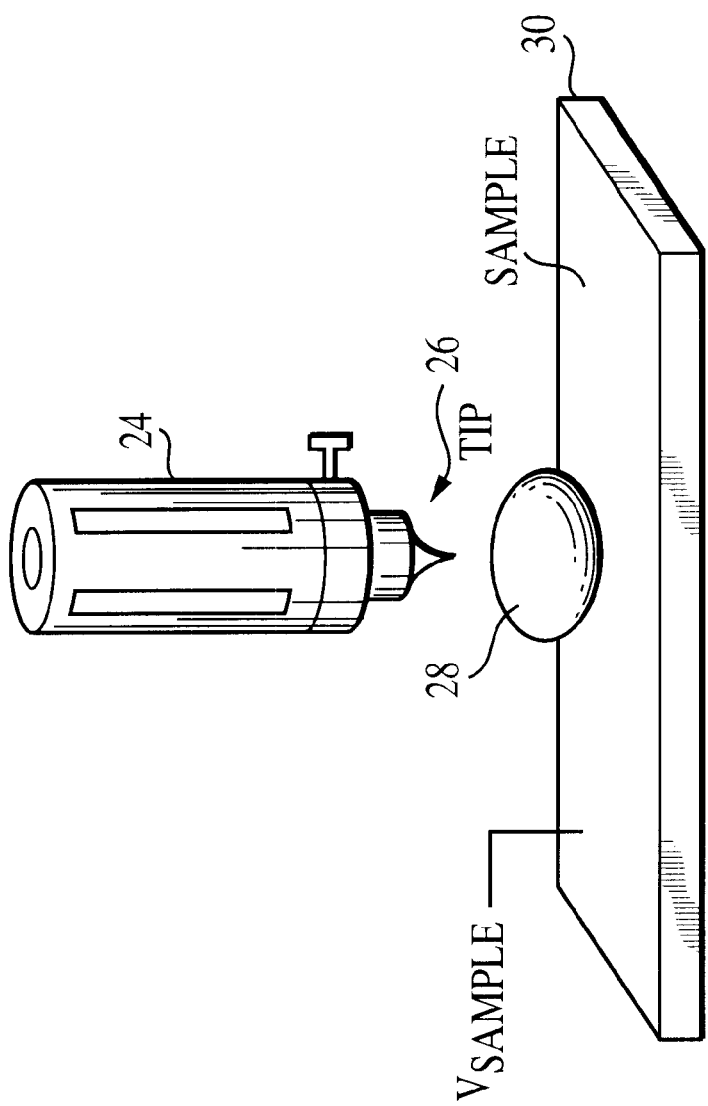
FIG. 16 illustrates an experiment to demonstrate a high temperature single electron transistors that utilize silicon nanoparticles on a device quality silicon.

A new concept of high temperature single electron technology (single electronics) including a high temperature single electron transistor can also be demonstrated with the silicon nanoparticles of the invention. In single electronics (single electron technology), device operation is based on the concept of one carrier for one bit of information. That is, it is based on one-by-one manipulation of electrons through a small sub-structure. A challenging problem for room temperature operation is that of thermal fluctuations. So far, reasonably long range quantum effects on transport properties have been mostly observed near liquid helium/liquid nitrogen temperatures. We tested high temperature single electronics that utilize ultra-small Si nanoparticles of the invention of uniform size of ~1 nm in diameter on a device quality Si substrate, using a two probe arrangement using a scanning tunneling microscope 24. The tip acts as the source and the substrate acts as the drain, as shown in FIG. 16. Single electron charging staircase and conductance resonance were observed at room temperature at a spacing of approximately 0.25 eV. However, the particles are too small to be conductive enough for the current to flow in the device via the energy level of the nanoparticles, since under standard doping levels of about $10^{15}/cm^3$, they would contain less than one in a million free electrons or holes. Extremely high temperature, higher than practical laboratory temperature would be needed to induce enough free charge carriers to switch on the device. Our measurements, however, show that under light irradiation we can create electron-hole pair carriers, allowing the single electron device to be switched on at room temperature, and resolve the discrete levels of the ultra-small Si quantum dots. Nearly 100 percent resolved single electron resonances are observed in the conductance spectra with a spacing consistent with the spacing of the energy levels of the particles. This development paves the way for construction of single electron transistors, optimized to work at high temperature.

Figure 17A:
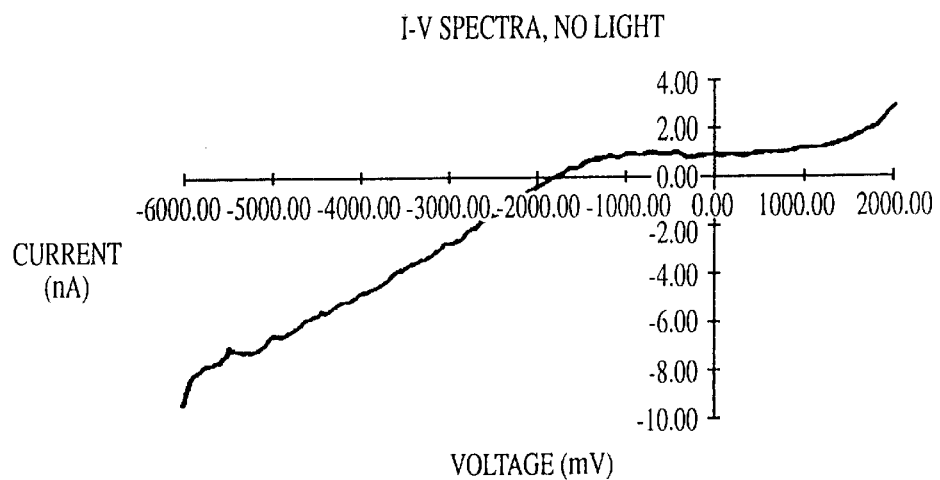
FIG. 17aa plots current vs. voltage spectra and FIG. 17ab plots their derivative of the silicon nanoparticle film on a silicon substrate in the dark.
Figure 17A:
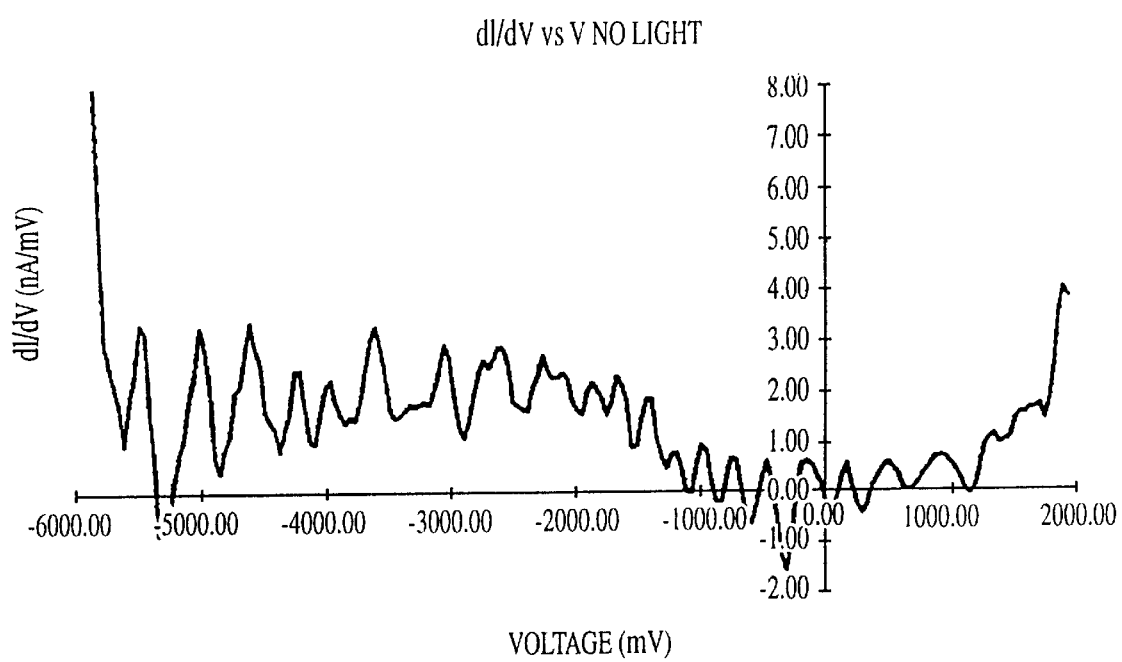
Figure 17B:
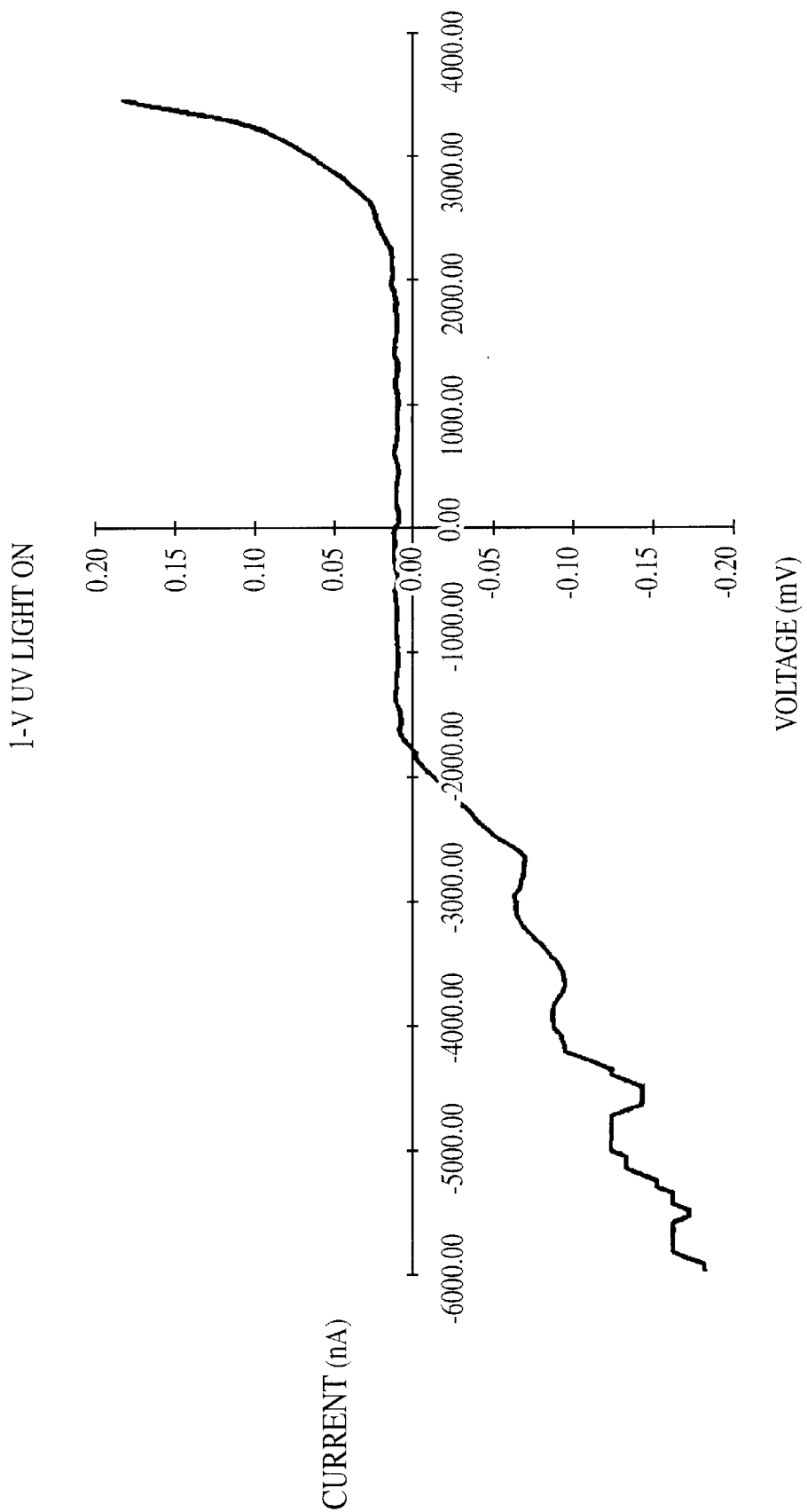
FIG. 17bplots current vs. voltage spectra of the silicon nanoparticle film taken with the light radiation from a mercury lamp.
Figure 17C:
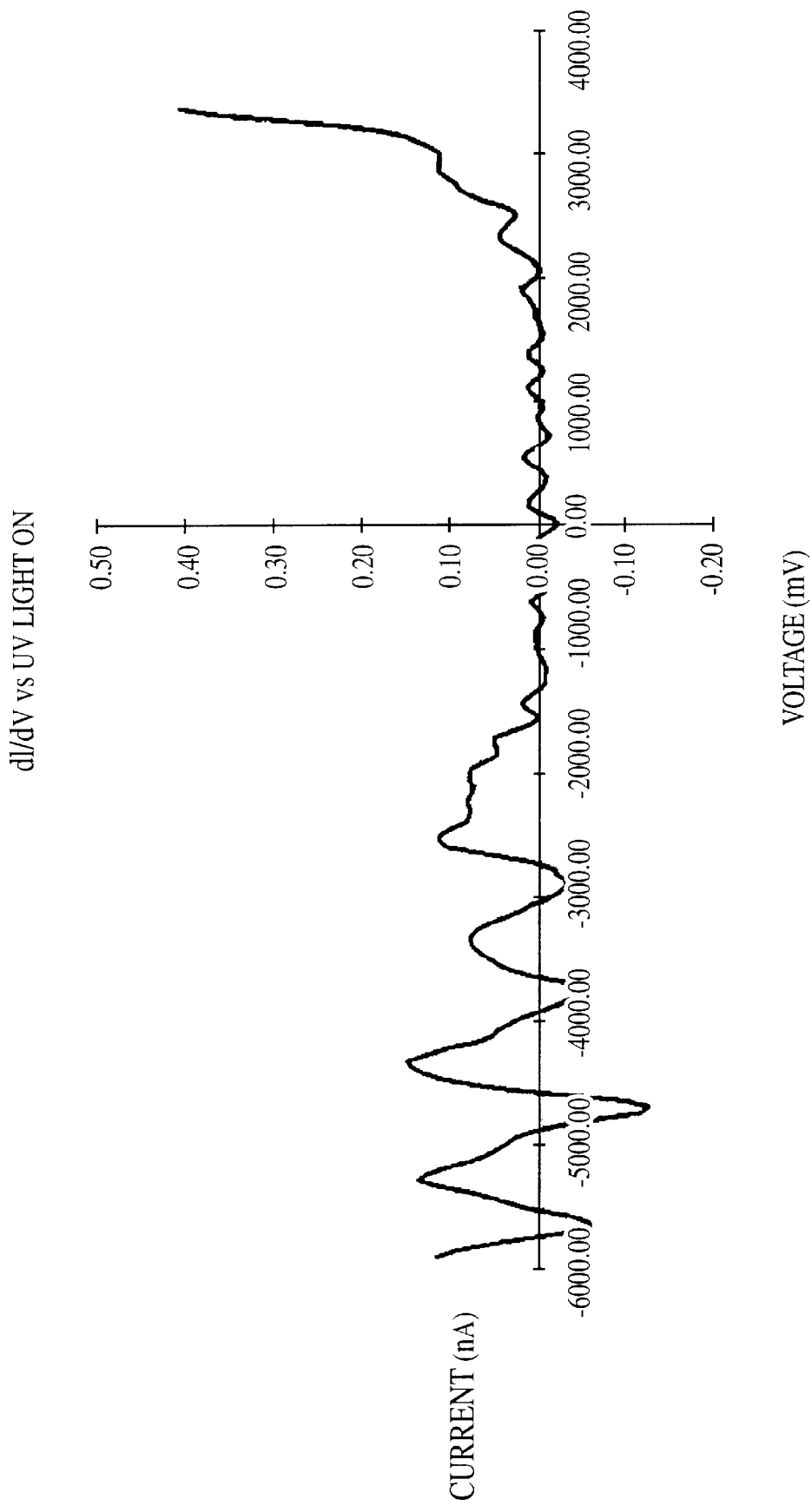
FIG. 17cshows the derivative of the I-V curve of FIG. 17b.

The tip 26 of the scanning tunneling microscope 24 is placed over the film material 28 at a constant height. In this two-terminal arrangement, the tip acts as the source, while the substrate 30 acts as the drain. In the measurement, the tunneling current was set at 1 nA and the biasing voltage at 3V in a constant current mode, giving a tip height of 3 A. The feed back loop is then disengaged allowing the tip to stay in a constant height mode while taking the I-V spectra. For instance, while the voltage of the tip was varied with respect to the (grounded) substrate in the range −6 to +3 eV, the tunneling current was recorded as shown along the derivative in FIG. 17ab. The spectrum shows no staircase feature in the I-V response due to the opening of tunneling channels as the Fermi energy level of the source is scanned across the particle's energy levels, but shows single electron charging effects of about 0.25 eV spacing. This spectrum is not very different from that of a silicon substrate blank, pointing to the fact that the film is inactive. FIG. 17b was taken with the light radiation from a mercury lamp directed on the sample. First, the spectrum shows some degree of inhibition of the tunneling current. Secondly it shows quite visible staircase feature in the I-V response. The derivative of the I-V curve, shown in FIG. 17c, in addition to the single electron charging resonances, clearly shows a progression of resonances that fade away towards zero biasing. Near 100 percent resolved single electron conductance resonances are observed with a spacing consistent with the spacing of the energy levels of the quantum dots. The resonances are regular with a near spacing of 1.0 V.

For the ultra-small silicon particles of the invention (~1 nm), the spacing of the energy levels, according to a standard theory of particle in a box is $E=3\pi^2 h^2/2\, md^2$. Using d=1 nm, and m=1.1×9.1×10$^{-31}$ kg, we get an energy of 1.03 eV. Also, for such ultra-small nanoparticles, the capacitance, C=2 $\pi\epsilon d$, where $\epsilon$ is the permittivity of silicon, is extremely small. Using d=1 nm, and $\epsilon=12\, \epsilon_0$ we get a capacitance of 0.67 aF (6.7×10$^{-19}$ F), hence the Coulomb gap due to an electron of charge e, $e^2/C$=0.23 eV, much larger than 0.025 eV, the thermal energy. Therefore quantum effects and discreteness of the electric charge are maintained at room temperature or higher. The measured spectrum and spacing of the energy levels is 1.0 V, consistent with the particle size of 1.1 nm. Thus, we conclude that the resonances are due to the opening of tunneling channels as the Fermi energy level of the source is scanned across the particle's energy levels.

Figure 18:
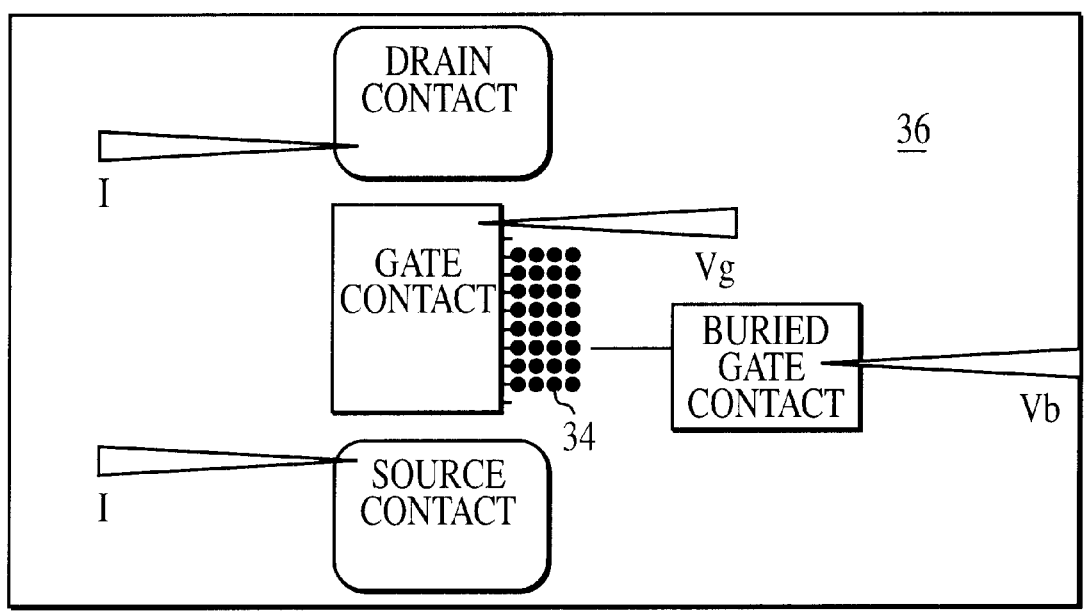
FIG. 18 schematically illustrates a silicon nanoparticle based single electron transistor, optimized to work at high temperature.

This development paves the way for construction of single electron transistors, optimized to work at high temperature as shown in FIG. 18. For instance, particles 34 may be implanted in the gate area of a Si MOSFET 36. Lateral transport across the source-drain channel of the transistor, through the particles, is expected according to theory to exhibit single electron effects as a function of the gate biasing. Light irradiation will switch the single electron operation.

The silicon nanoparticles also form the basis for semiconductor lasers. In preparing some nanoparticles, we also studied the solid Si anode samples after etching, but before the separation of nanoparticles from the surface. In this case, we used a Ti-Sapphire infrared femto second laser system, 150 fs pulse duration and a repetition rate of 80 MHz. At the target, the average power, 5–25 mW, is focused to a spot of 1.5 $\mu$m using a 0.45 NA lens, giving an average power density of 2×10$^6$ W/cm$^2$ (peak power density of 10$^{11}$ W/cm$^2$) at the high end of this range. The beam-sample interaction region is viewed via an optical microscope (×10) and can be scanned allowing photoluminesce imaging. The incident intensity was varied by neutral density filters. Emission is detected by a photomultiplier and stored in a two dimensional array.

Figure 19A:
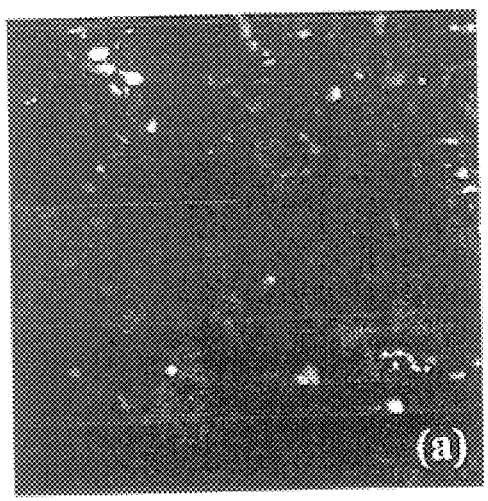
FIGS. 19a and 19b are the luminescence images of a 132×132 μm silicon nanoparticle section prior to separation from the wafer, respectively, taken at an average intensity of $5.7 \times 10^5$ and $8 \times 10^5$ W/cm$^2$ (at 780 nm wavelength)
Figure 19B:
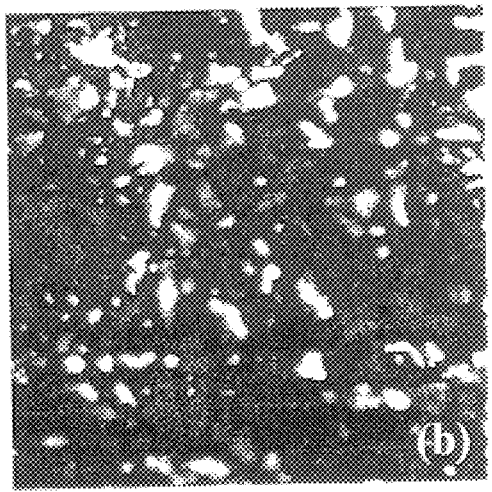

FIG. 19a gives the luminescence image of a 132×132 $\mu$m nanoparticle section still on a surface of the wafer, taken at an average intensity of 5.7×10$^5$ W/cm$^2$), and 780 nm wavelength. The image shows that the surface is broken up into irregular luminescent islands of a few micrometer across. The island topography is reproduced in electron scanning microscopy. FIG. 19b is an image of the same section taken at an average power density of 8×10$^5$ W/cm$^2$ and shows numerous, extremely bright spots, while most of the surface stays only moderately luminescent. The bright spots on the sample are aggregates of ultra small structures. Brighter spots are found in regions where the anodizing current concentrates, such in the meniscus (air-liquid interface) or at sharp edges or points of surface steps or grooves. Previous studies showed that higher current density catalyzes etching rates, resulting in smaller substructure.

Figure 20:
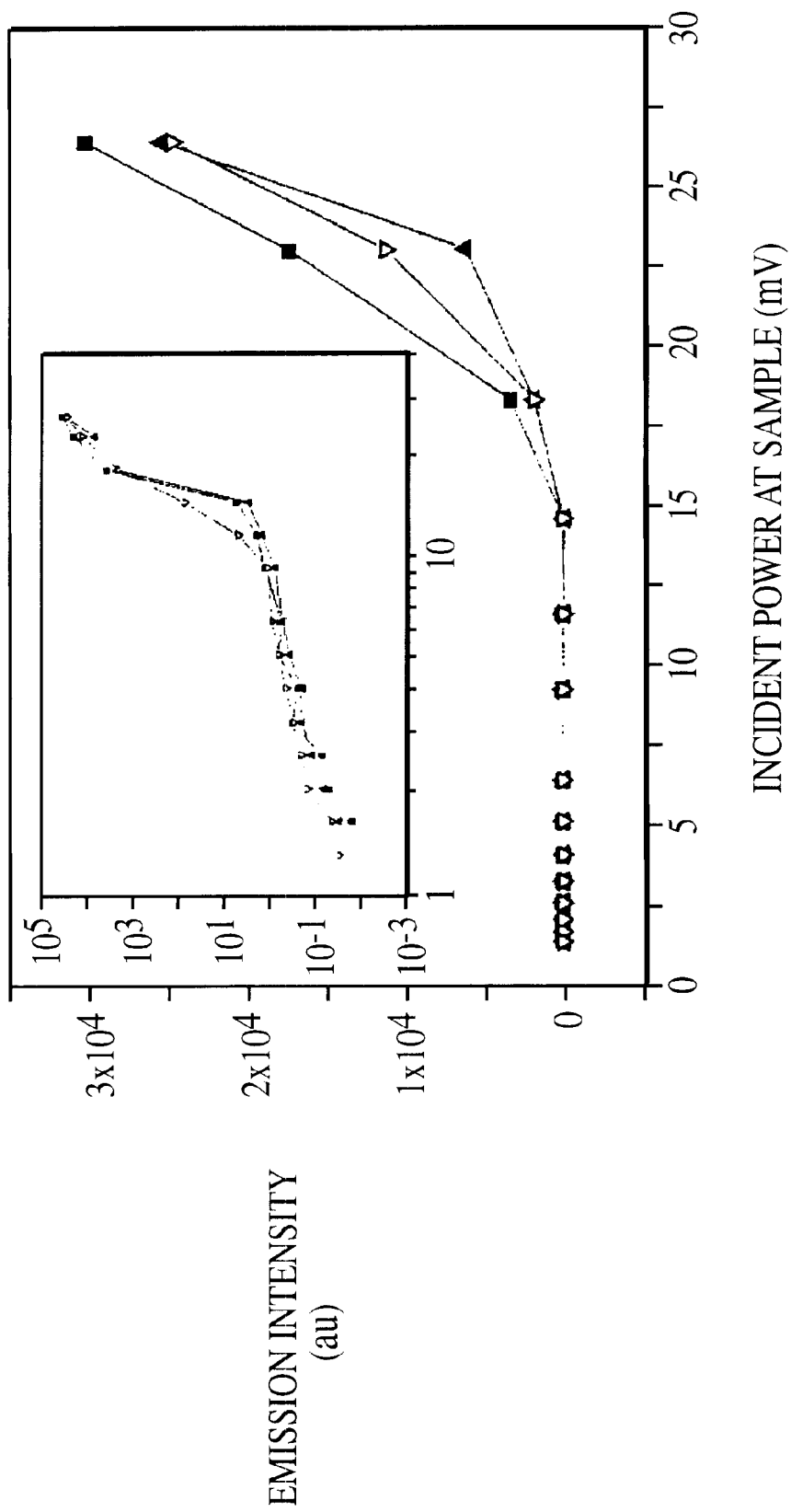
FIG. 20 plots the emission intensity for several of the individual bright spots seen in FIG. 19, as a function of the incident intensity.
Figure 21:
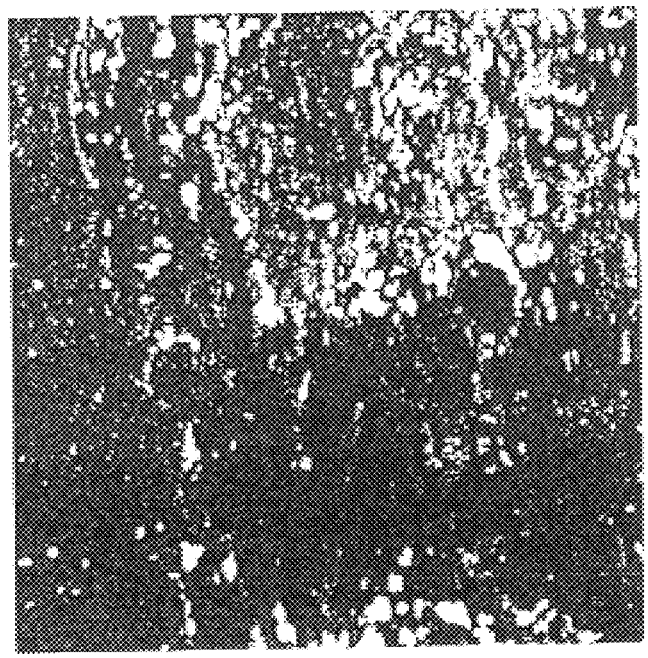
FIG. 21 is a luminescent image of a silicon nanoparticle section prior to separation from the wafer and passivated with a high quality oxide.

FIG. 20 displays the emission intensity for several of the individual bright spots seen in FIG. 19, as a function of the incident intensity. Across a threshold of ~average intensity of 5×10$^5$ W/cm$^2$, the intensity of the photoluminesce rises by several orders of magnitude. From the log-log inset, we see a dramatic increase in the slope of the power pumping curve from ~1.6 below threshold to ~11–12 above threshold. In regions clear of the bright areas, the power dependence, for incident intensity in the range of the threshold, is 1.6. This suggests two-photon absorption processes with some saturation. Moreover, for intensity much lower than ~5×10$^5$ W/cm$^2$, the power dependence is 1.9–2. In another measurement, the incident beam was focused on individual bright spots while the intensity is varied using neutral density filters, giving similar results. A 132 $\mu$m×132 $\mu$m section of nanoparticles still on the surface of a wafer and passivated with a high quality oxide by immersion in hydrogen peroxide, show similar behavior, as seen in the image of FIG. 21. Thus, an oxide coating does not degrade emission response of the nanoparticles.

Figure 22A:
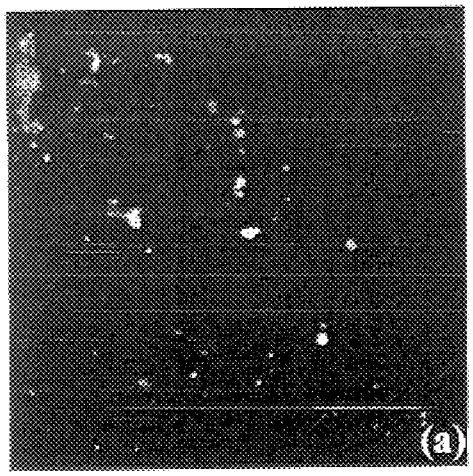
FIGS. 22a and 22b give luminescence images a sample taken at an incident average power in CW mode at 820 nm respectively focused to $6.7 \times 10^6$ and $8.3 \times 10^6$ W/cm$^2$.
Figure 22B:
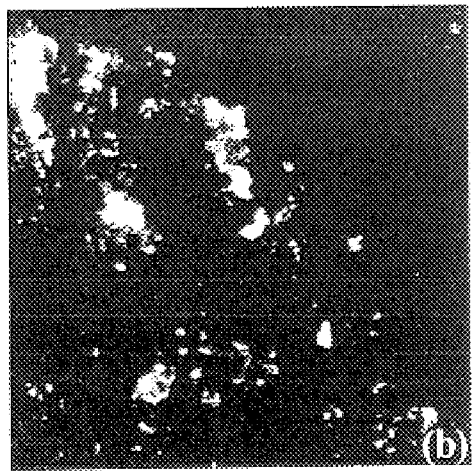

Operating the laser in CW mode provides a beam of the same average power, focused to the same spot size. FIGS. 22a and 22b gives luminescence images taken at an incident average power of 21, and 26 mW at 820 nm focuses to $-6.7 \times 10^6$ and $8.3 \times 10^6$ W/cm$^2$ for the sample of FIG. 19. Unlike the pulsed excitation, the surface is mostly dim all over, i.e. there is no orange/red emission. As the intensity rises as shown in FIG. 22b, bright isolated regions turn on in a similar fashion to the pulsed case, while the rest of the material remains inactive.

Figure 23:
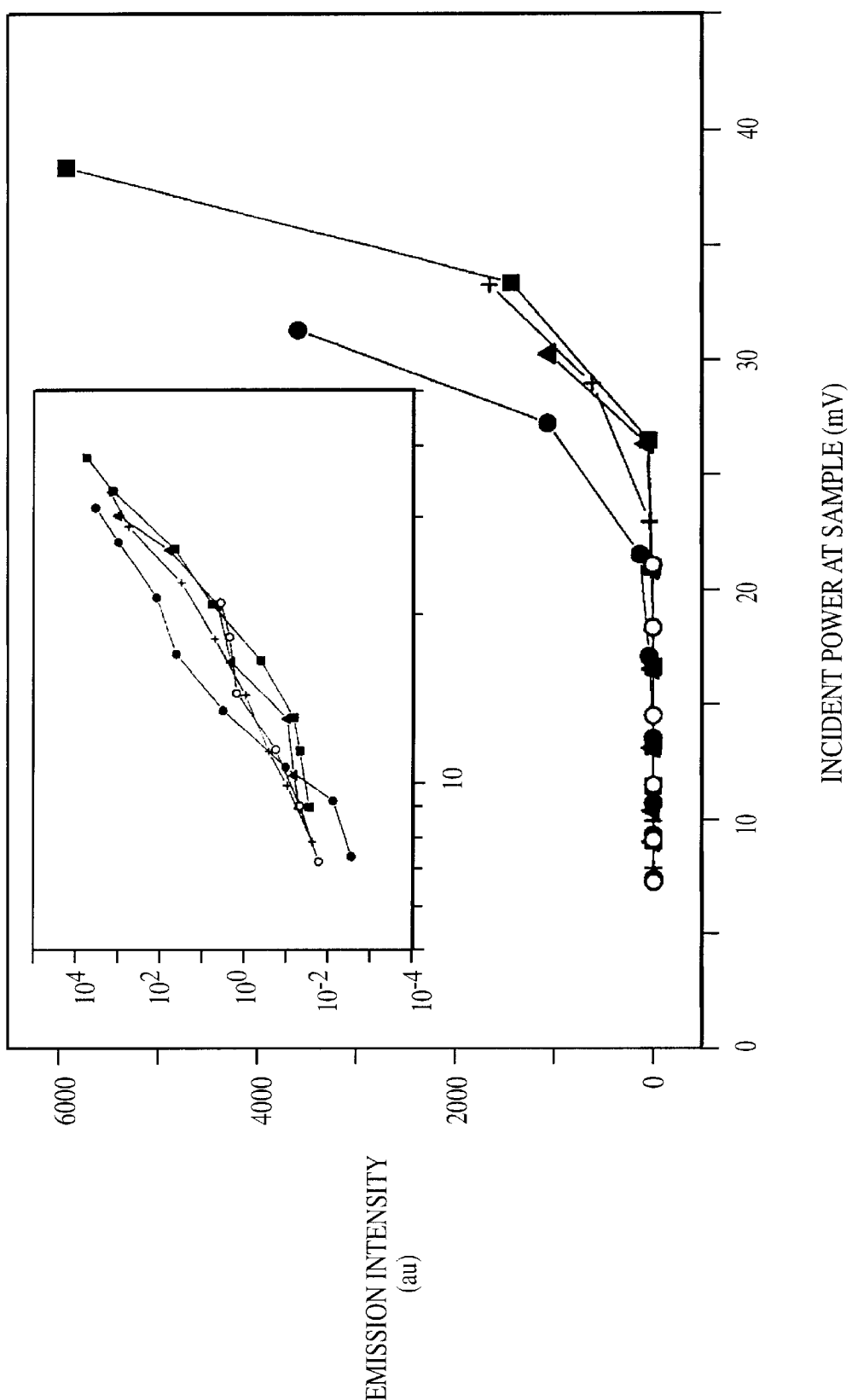
FIG. 23 plots the development of the CW power pumping curves of the integrated emission from the 132×132 μm sample of FIG. 22.
Figure 24A:
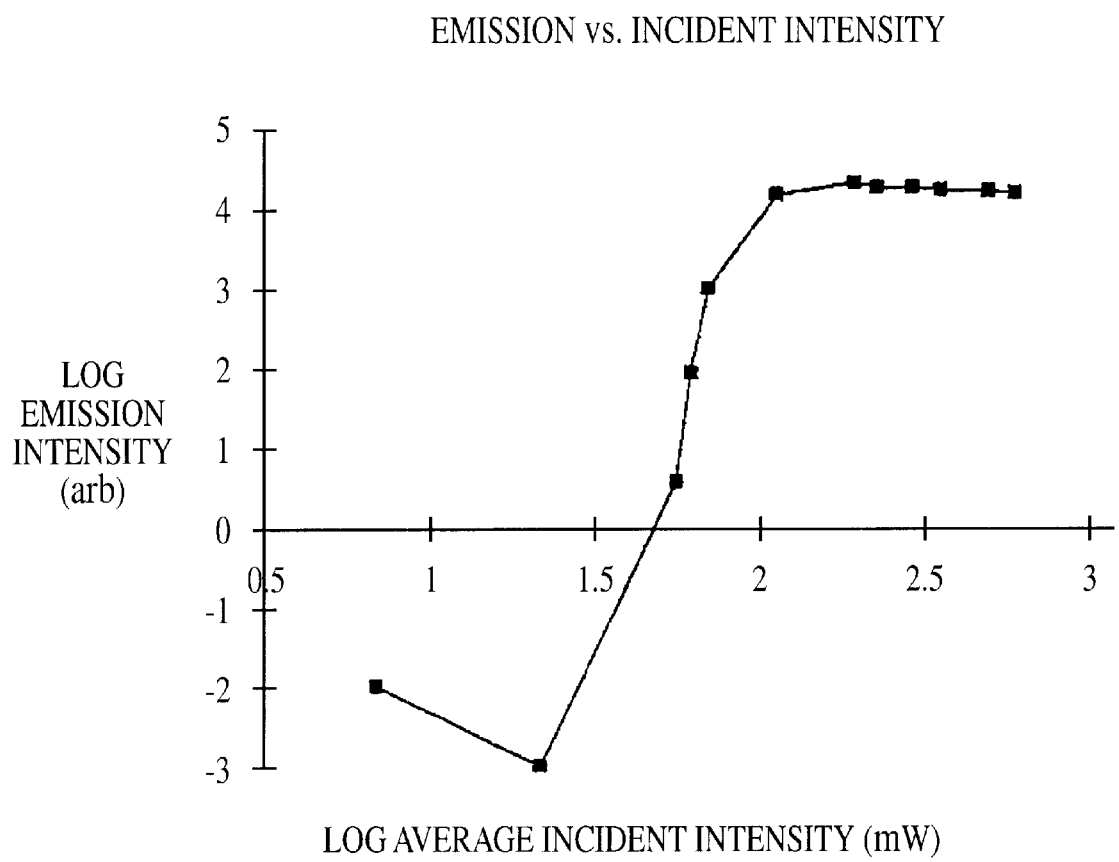
FIG. 24a is a power pumping curve of the emission as a function of the incident average power, for a reconstituted film of silicon nanoparticles of the invention.

FIG. 23 displays the development of the CW power pumping curves of the integrated emission from the 132× 132 $\mu$m section of FIG. 22, showing that the threshold for turn on occurs at average powers comparable to the pulsed case. The log-log inset shows that the slope, above threshold, is ~10. Thus the fact that the effect was maintained under CW excitation indicates reasonably rapid relaxation of the lower state of the transition to the ground state. The excitation efficiency (product of absorbtion and emission efficiencies) as a function of incident wavelength in the range 720–860 nm was measured. The results, taken at incident average intensity of 80 mW, well above the reported threshold, shows a trend of increase with decreasing wavelengths in this range. The large variance in the power dependence across the narrow intensity range resembles stimulated emission in systems of inverted population. Similar measurements on reconstituted films of silicon nanoparticles, seen in FIG. 24a, show that the emission exhibits the sharp threshold, but it is steeper and stronger.

Gain is explained using FIG. 5 which displayed the diatomic structure in the ground and first excited electronic states as a function of bond length for crystallites 1.03 nm in diameter. According to the Frank-Condon principle, trapping states radiate vertically down, maintaining the bond length, followed by rapid relaxation to the equilibrium bond length of 2.35 A. Since the lower state of the radiative transition is a high lying, unpopulated state, the system may constitute a four-level gain media. The double well structure of the excited state is interesting. Excitation into the inner well is long-lived against emission and nonradiative recombination, with a lifetime in the range of 100 $\mu$s to 1 ms. This can be used as a storage well. The outer well is a strong emitter to unoccupied highly excited vibrational levels of the ground well. Quantum tunneling or thermal activation transfers the population from the storage to the outer well, and stimulated emission is achieved. Switching can also be achieved and controlled by a light or electric pulse that elevates the population closer to the top of the barrier.

Highly packed particles, as in a solid film, provide the basis for semiconductor lasing. The initial gain coefficient is $\gamma = \Delta N \lambda^2 \Delta v/(8\pi n^2 \pi)$ where $\Delta N = N_2 - N_1$ is the population inversion, n is the refractive index, $\Delta v$ is the emission width, $\lambda$ is the emission wavelength, and $\pi$ is spontaneous lifetime. We use $\pi = 1$ $\mu$s, $\lambda = 400$ nm, n=2, and $\Delta v = 100$ nm (~$10^{14}$ Hz). In nanocrystallite silicon of 30 atoms (1 nm diameter), two thirds of which are surface atoms and hence they pair. With near saturated absorption, followed by strong transfer to the outer well, we expect the density of the excited emitters to be nearly 25 percent of the atomic solid density (~$1.5 \times 10^{22}$/cm$^3$). With these parameters, $\gamma = 1.5 \times 10^3$/cm$^{-1}$. This high gain allows considerable growth over microscopic distances (0.3 for a 2 $\mu$m long pass). The number of spontaneous emission modes is given by $p = 8\pi \Delta v n^3 V/\lambda^2 c$ where V is the active volume. Using an active cross section of $(2 \mu m)^2$ and an active sample thickness of 0.2 $\mu$m, we get p~$10^3$, sizable even for microscopic volume.

For a colloid of dispersed particles, a gain path can be constructed at will. With a particle density of $10^{19}$/cm$^3$ a single pass of 1 cm may be used. For a single pass of one only needs a concentration of $10^{17}$/cm$^3$. For multi-passes as in a closed cavity, much lower densities are sufficient.

To achieve appreciable absorption, at the powers used in the experiment, namely at $5 \times 10^{10}$ W/cm$^2$ (photon flux of $2 \times 10^{29}$/cm$^2$s), one needs to induce a transition rate R that compares with the reciprocal of the pulse duration T. For RT=0.5, for example, where T=150 fs, R=$4 \times 10^{12}$/s. This requires a two-photon absorption "cross section" $\beta$~$10^{46}$ cm$^4$ sec, with an absorption rate R=$\beta F^2$ where F is the number of incident photons/cm$^2$ sec. A 30 mW continuous wave, on the other hand, focused to ~$2 \times 10^6$ W/cm$^2$ (photon flux of $0.8 \times 10^{25}$/cm$^2$ s), which gives a corresponding absorption rate of $10^3$/s, down by several orders of magnitude from the pulsed case, but large enough to produce significant accumulation in the inner storage well (100 $\mu$m-ms decay time). We should also note that at a repetition rate of 80 MHz, the emission lifetime (1–100 $\mu$s) is much longer than the duty cycle (time between pulses 12 ns). But the transfer of the population to the outer well proceeds strongly only in ultra-small nanoparticle of about 2 nm or less. Although there is analytical theory for a single photon absorption in nanocrystallites, there are no calculations for two-photon processes.

There are several potential pumping schemes, including (i) Pulsed single photon UV excitation (ii) Pulsed two-photon infrared excitation (iii) Continuous wave (CW) excitation (iv) Electron injection. If necessary, due to particle density, microcavities may be constructed to provide the necessary feedback. For the liquid forms, the enrichment of the particles may not yield a high gain media. In this case a traditional cavity consisting of a long channel of a small diameter capillary provides a long pass of the gain media to offset if the low particle density.

On the other hand, the silicon colloid may be solidified by applying an electric field to the disordered fluid. Particles take only milliseconds to form long "pearl" chains. A few seconds later, the chains aggregate into columns. Field strength of 1 KV/cm is needed to achieve solidification. Such solidification increases the linear density, hence reduce the single pass length, allowing compact cavities.

Colloidal micro crystallites are formed on device quality silicon by gentle evaporation from a volatile acetone colloid. Those were shown in FIG. 15a. We pumped the micro crystals by femto-second pulsed radiation at 780 nm. We observed blue laser action in a colloidal crystallite micro cavity, with the sides of the crystallite acting as reflectors.

Figure 24B:
FIG. 24b is an image showing a blue emission beam propagating in the interior of a silicon nanoparticle crystallite, locally normal to the stimulated side of the crystallite.
Figure 25:
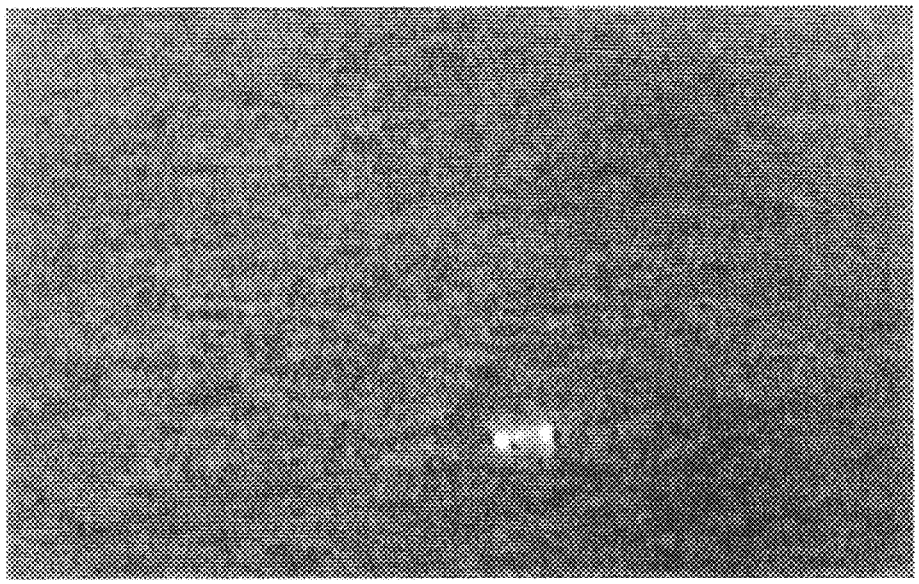
FIG. 25 is an image showing emission in a case where the opposite faces of a silicone nanoparticle crystallite are parallel, with a blue beam that is sustainable, well collimated, and smaller than the cross section of the interaction spot.

The interaction of the microcrystallites with the femto-second beam is now presented. The incident beam strikes the film in a normal incidence configuration, and we observed the plane of the film with an optical microscope, vidicon camera, and a photomultiplier in the normal direction. We find interesting phenomena in the recrystallization region, in the transverse direction, namely in the plane of the film. A typical beam target interaction shows a 2 m wide spot of intense "white blue" emission. When the interaction spot gets close to a side face in a crystallites as in FIG. 24b, there emerges from the interaction spot a navy blue beam in the plane of the sample, propagating in the interior of the crystallite, locally normal to the targeted side of the crystallite. The blue beam is 1 μm across, smaller than the diameter of the interaction spot, and fades away, while getting narrower, after propagation of several microns inside the crystallite. The fading and reduction in the cross section may be due to re-absorption and scattering. FIG. 25 shows a case where the opposite faces of a crystallite are parallel and close to each other. In this case, when the interaction spot is close to one side, the blue beam emerges, reaching the other side without fading or getting narrower, i.e., it is sustainable, well collimated, and smaller than the cross section of the interaction spot. It is to be noted that in this case, a strong but weaker "white blue" secondary spot forms on the side opposite to the side where the interaction is taking place. The secondary spot may be a result of pumping of material by the induced luminescence, and it appears before the incident beam gets close enough to one of the sides such that blue beam is observed. The luminescence bandwidth covers 380–450 nm, energetic enough to pump silicon nanoparticle material itself The parallel side configuration is found symmetric under the translation of the interaction beam between the opposite faces. If the two side faces are close but not parallel, a blue fading beam may make it to the opposite side, but it would not be strong enough to produce a secondary bright spot.

Figure 26:
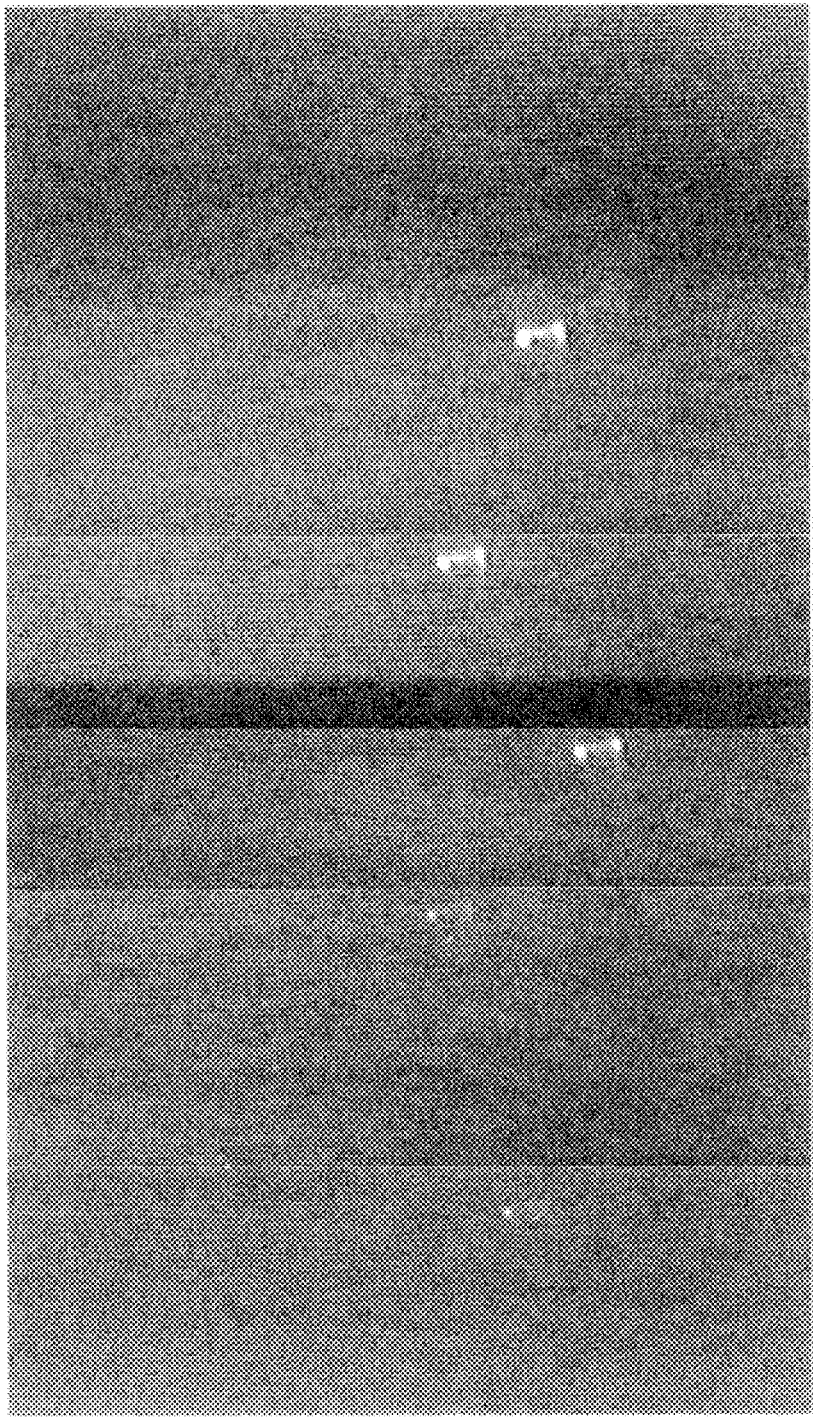
FIG. 26 are images of the blue beam in a silicon nanoparticle crystallite as the intensity of the incident excitation beam is gradually reduced.

Finally, the blue beam is characterized by a threshold phenomenon. When the intensity of the incident excitation beam was reduced while monitoring the parallel face case as shown in the series of images in FIG. 26, we found that the blue beam fades away, and then disappears, while the interaction spot fades somewhat but remain bright. Moreover, when the interaction spot is moved to the interior away from the faces of the crystallite, the interaction produces no blue beam. This may be due to the fact that only a small fraction of the emission may be reflected back (small solid angle reflection by the face), hence limited feedback. Increasing the feedback is achieved by pumping close to one side of the micro cavity. For instance when pumping at the face, a large fraction (nearly half of the light corresponding to a 2π solid angle) may be fed back into the gain region by the face reflector.

These beam characteristics (narrow, directed with little divergence, monochromatic and features a threshold phenomenon) point to a micro laser action in a micro cavity, with the two sides of the crystallite acting as mico reflectors.

While various embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

What is claimed is:

1. A method for producing elemental silicon nanoparticles, the method comprising steps of:
   gradually advancing a silicon anode into an HF acid $H_2O_2$ etchant solution;
   providing a flow of electrical current to the silicon anode as it is gradually advanced and to a cathode in electrical contact with the etchant solution;
   separating the silicon anode from the etchant solution.

2. The method according to claim 1, further comprising a step of:
   separating silicon nanoparticles from the silicon anode.

3. The method according to claim 2, wherein said step of separating silicon nanoparticles comprises:
   subjecting the silicon anode to force to separate silicon nanoparticles from the silicon anode.

4. The method according to claim 3, wherein the force in said step of subjecting is provided by ultrasound waves.

5. The method according to claim 2, wherein said step of separating silicon nanoparticles comprises:
   placing the silicon anode in a solvent and subjecting the silicon anode to force to separate silicon nanoparticles from the silicon anode.

6. The method of claim 5, further comprising a step of rinsing the silicon anode subsequent to said step of removing and prior to said step of placing the silicon anode in a solvent solution.

7. The method according to claim 1, wherein said step of gradually advancing comprises gradually vertically immersing the silicon anode.

8. The method according to claim 7, wherein said step of gradually advancing immerses the silicon anode at a rate of about one millimeter per hour.

9. The method according to claim 1, further comprising a step of doping the silicon nanoparticles.

10. The method according to claim 1, further comprising a step of coating the silicon nanoparticles.

11. The method according to claim 10 wherein said step of coating comprises immersion of the silicon nanoparticles in $H_2O_2$ to oxide coat the silicon nanoparticles.

12. The method according to claim 10, wherein said step of coating comprises coating said particles with biological material.

13. The method according to claim 1, wherein the cathode is formed from platinum, the silicon anode comprises a single crystalline silicon wafer, and the etchant solution comprises HF acid, $H_2O_2$ and methanol.

14. The method according to claim 13, wherein the silicon wafer comprises p-type boron-doped silicon.

15. The method according to claim 2, further comprising a step of precipitating the silicon nanoparticles from a volatile solvent to prepare a thin film of silicon nanoparticles.

16. The method according to claim 2, further comprising a step of solidifying the silicon nanoparticles into nanoparticle colloids.

17. The method according to claim 15, wherein said step of solidifying the silicon nanoparticles comprises applying an electric field to a solution including collected silicon nanoparticles.

18. The method according to claim 2, further comprising a step of molding the silicon nanoparticles into a desired geometry.

\* \* \* \* \*

UNITED STATES PATENT AND TRADEMARK OFFICE
CERTIFICATE OF CORRECTION

PATENT NO.     : 6,585,947 B1
DATED          : July 1, 2003
INVENTOR(S)    : Nayfeh et al.

It is certified that error appears in the above-identified patent and that said Letters Patent is hereby corrected as shown below:

<u>Title page,</u>
Item [56], References Cited, OTHER PUBLICATIONS, "G.M. Credo," reference, delete "vol. 4" and insert -- vol.74 --; delete "Bosyton" and insert -- Boston --; and insert -- Pavesl, L. Dal Negro, C. Mazzoleni, G. Franzo and F. Prlolo, "Optical gain in silicon nanocrystals", Nature, Vol. 408, 23 November 2000, pp. 440-443 --.

<u>Column 9,</u>
Line 9, delete "d=kT/3πD" and insert -- d=kT/3πηD --.

<u>Column 13,</u>
Line 61, delete "π=1 $\mu$s" and insert -- τ=1 $\mu$s --.

<u>Column 14,</u>
Line 10, after "pass of" and before "one only needs" insert -- 1 m --.
Line 17, delete "β~$10^{46}$ $cm^4$" and insert -- β~$10^{-46}$ $cm^4$ --.

Signed and Sealed this

Ninth Day of March, 2004

JON W. DUDAS
*Acting Director of the United States Patent and Trademark Office*